(12) United States Patent
Yoshihara et al.

(10) Patent No.: US 9,773,720 B2
(45) Date of Patent: Sep. 26, 2017

(54) POWER MODULE AND FABRICATION METHOD FOR THE SAME

(71) Applicant: ROHM CO., LTD., Kyoto-shi, Kyoto (JP)

(72) Inventors: Katsuhiko Yoshihara, Kyoto (JP); Masao Saito, Kyoto (JP)

(73) Assignee: ROHM CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/092,308

(22) Filed: Apr. 6, 2016

(65) Prior Publication Data

US 2016/0218050 A1 Jul. 28, 2016

Related U.S. Application Data

(63) Continuation of application No. PCT/JP2014/076690, filed on Oct. 6, 2014.

(30) Foreign Application Priority Data

Oct. 7, 2013 (JP) ................................. 2013-210222

(51) Int. Cl.
*H01L 23/492* (2006.01)
*H01L 23/00* (2006.01)
(Continued)

(52) U.S. Cl.
CPC ...... *H01L 23/4924* (2013.01); *H01L 21/4871* (2013.01); *H01L 21/565* (2013.01);
(Continued)

(58) Field of Classification Search
None
See application file for complete search history.

(56) References Cited

U.S. PATENT DOCUMENTS 4,541,003 A * 9/1985 Otsuka ............... H01L 21/26
174/350
5,655,288 A * 8/1997 Onishi ............... B41J 2/3353
29/611
(Continued)

FOREIGN PATENT DOCUMENTS

JP 06-334114 12/1994
JP 10-93015 4/1998
(Continued)

OTHER PUBLICATIONS

International Search Report of PCT/JP2014/076690, dated Dec. 22, 2014, 1 page total.
(Continued)

*Primary Examiner* — William Coleman
*Assistant Examiner* — Kien Ly
(74) *Attorney, Agent, or Firm* — Hamre, Schumann, Mueller & Larson, P.C.

(57) ABSTRACT

A power module includes: an insulating layer; a first metallic plate disposed on the insulating layer; a first semiconductor chip disposed on the first metallic plate; a first adhesive insulating layer and a second adhesive insulating layer disposed on the first metallic plate; a first metallic land for main electrode wiring disposed on the first adhesive insulating layer; and a first metallic land for signal wiring disposed on the second adhesive insulating layer. There can be provided a power module having reduced cost, reduced warpage of the whole of a substrate, stabilized quality, and improved reliability; and a fabrication method for such a power module.

21 Claims, 18 Drawing Sheets

(51) Int. Cl.
    *H01L 23/373*     (2006.01)
    *H01L 23/367*     (2006.01)
    *H01L 21/48*     (2006.01)
    *H01L 23/495*     (2006.01)
    *H01L 25/07*     (2006.01)
    *H01L 21/56*     (2006.01)
    *H01L 23/31*     (2006.01)
    *H01L 25/18*     (2006.01)

(52) U.S. Cl.
CPC ...... *H01L 23/3121* (2013.01); *H01L 23/3675* (2013.01); *H01L 23/3735* (2013.01); *H01L 23/3737* (2013.01); *H01L 23/49506* (2013.01); *H01L 23/49531* (2013.01); *H01L 23/49537* (2013.01); *H01L 23/49541* (2013.01); *H01L 23/49575* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 25/07* (2013.01); *H01L 25/18* (2013.01); *H01L 24/45* (2013.01); *H01L 2224/0603* (2013.01); *H01L 2224/29387* (2013.01); *H01L 2224/32245* (2013.01); *H01L 2224/45124* (2013.01); *H01L 2224/48091* (2013.01); *H01L 2224/48137* (2013.01); *H01L 2224/48227* (2013.01); *H01L 2224/48245* (2013.01); *H01L 2224/48472* (2013.01); *H01L 2224/49111* (2013.01); *H01L 2224/49113* (2013.01); *H01L 2224/49175* (2013.01); *H01L 2224/73265* (2013.01); *H01L 2224/83801* (2013.01); *H01L 2224/92247* (2013.01); *H01L 2924/01004* (2013.01); *H01L 2924/01005* (2013.01); *H01L 2924/01012* (2013.01); *H01L 2924/0503* (2013.01); *H01L 2924/05032* (2013.01); *H01L 2924/0532* (2013.01); *H01L 2924/05042* (2013.01); *H01L 2924/05342* (2013.01); *H01L 2924/05432* (2013.01); *H01L 2924/05442* (2013.01); *H01L 2924/069* (2013.01); *H01L 2924/0635* (2013.01); *H01L 2924/0665* (2013.01); *H01L 2924/07025* (2013.01); *H01L 2924/1033* (2013.01); *H01L 2924/10253* (2013.01); *H01L 2924/10272* (2013.01); *H01L 2924/1203* (2013.01); *H01L 2924/1306* (2013.01); *H01L 2924/13055* (2013.01); *H01L 2924/13091* (2013.01); *H01L 2924/15724* (2013.01); *H01L 2924/15747* (2013.01); *H01L 2924/181* (2013.01); *H01L 2924/19107* (2013.01)

(56) References Cited

U.S. PATENT DOCUMENTS

| | | | |
|---|---|---|---|
| 2003/0038346 | A1 | 2/2003 | Beer et al. |
| 2008/0142947 | A1 | 6/2008 | Pan et al. |
| 2011/0100681 | A1 | 5/2011 | Kimmich et al. |
| 2014/0055173 | A1* | 2/2014 | Shiraishi ............ H01L 27/0617 327/109 |
| 2014/0151718 | A1* | 6/2014 | Yanagimoto ...... H01L 23/49503 257/77 |

FOREIGN PATENT DOCUMENTS

| | | |
|---|---|---|
| JP | 2001-007281 | 1/2001 |
| JP | 3201277 | 8/2001 |
| JP | 2005-109100 | 4/2005 |
| JP | 2010-080611 | 4/2010 |

OTHER PUBLICATIONS

Partial Supplemental European Search Report; European Patent Application No. 14853126.2, dated May 19, 2017, 14 pages.

\* cited by examiner

FIG. 1 - Prior Art
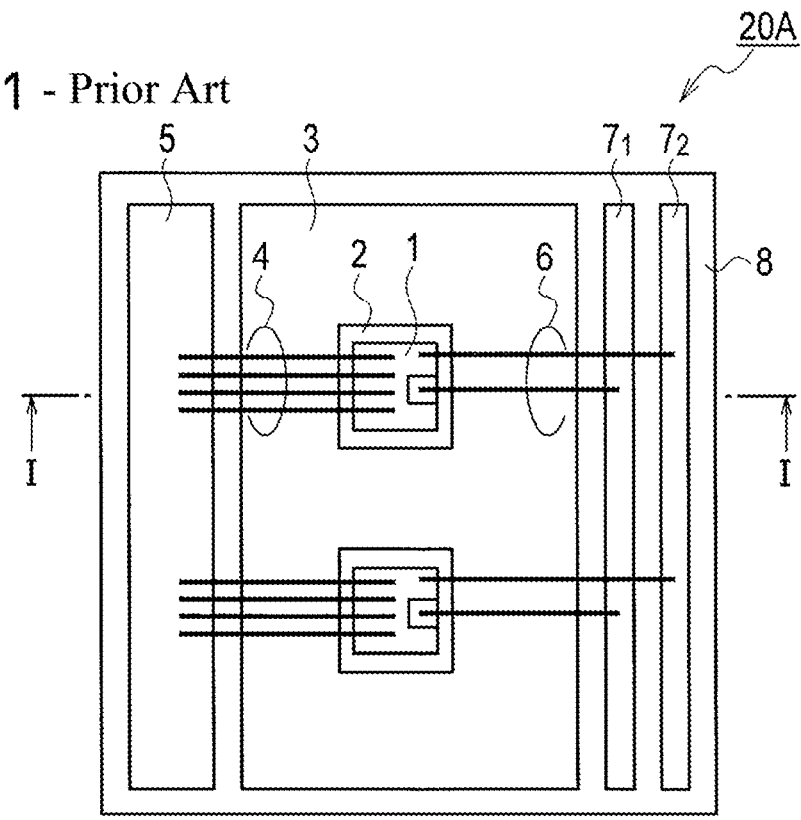
FIG. 2 - Prior Art
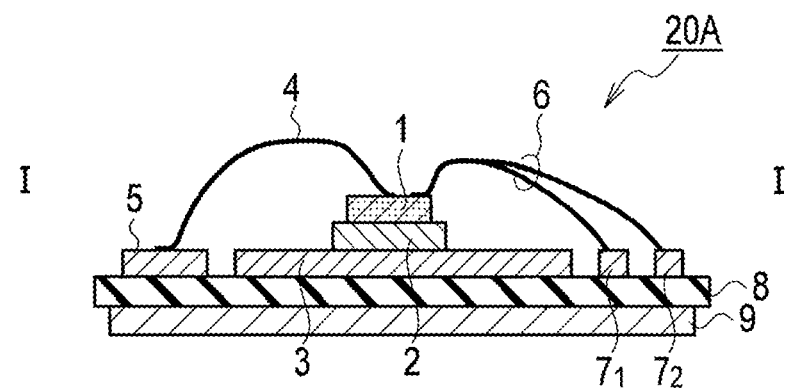

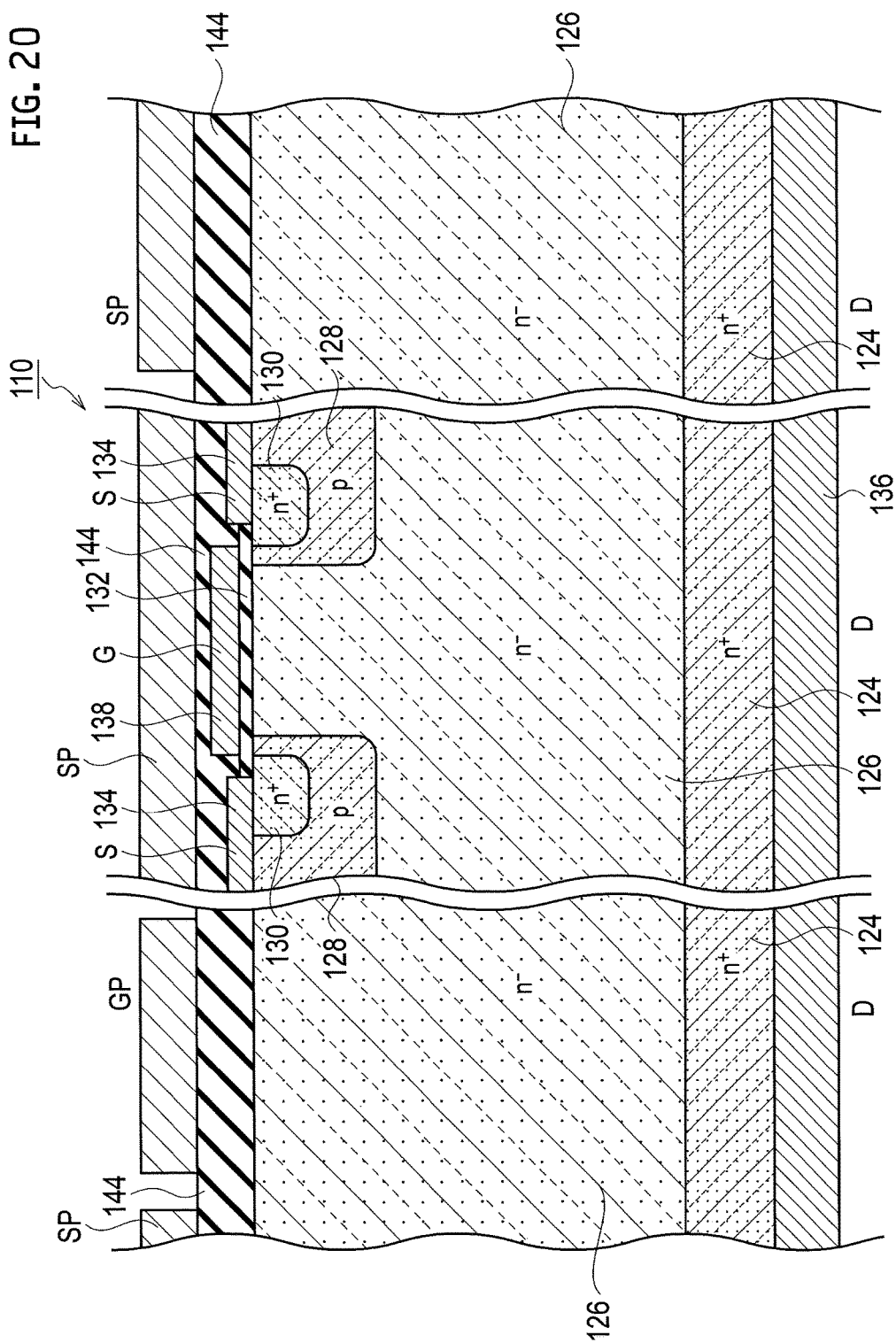

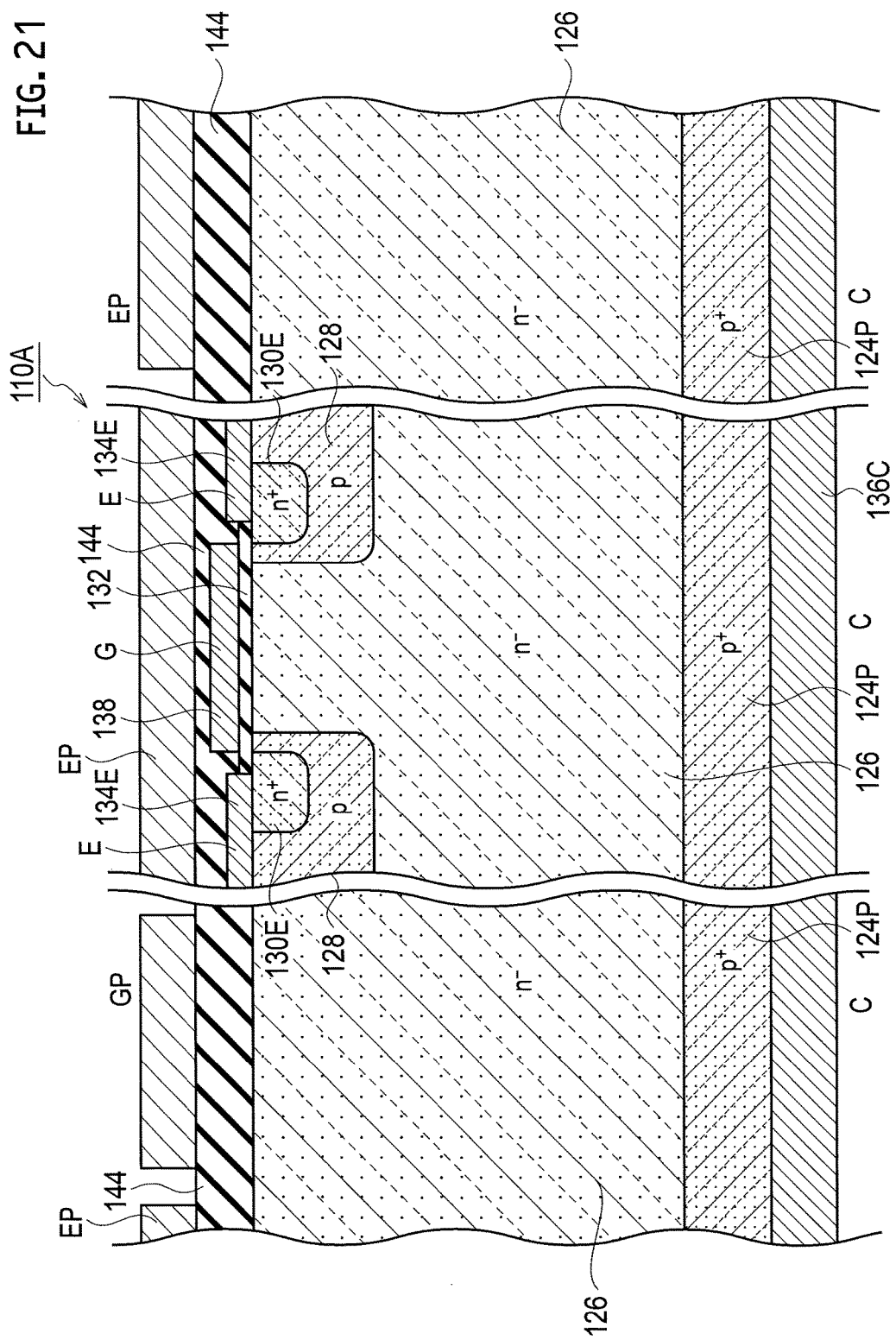

POWER MODULE AND FABRICATION METHOD FOR THE SAME

CROSS REFERENCE TO RELATED APPLICATIONS

This is a continuation application (CA) of PCT Application No. PCT/JP2014/076690, filed on Oct. 6, 2014, which claims priority to Japan Patent Application No. P2013-210222 filed on Oct. 7, 2013 and is based upon and claims the benefit of priority from prior Japanese Patent Applications P2013-210222 filed on Oct. 7, 2013 and PCT Application No. PCT/JP2014/076690, filed on Oct. 6, 2014, the entire contents of each of which are incorporated herein by reference.

FIELD

The embodiment described herein relates to a power module and a fabrication method for such a power module.

BACKGROUND

Conventionally, there have been known power modules in which a power chip including a semiconductor device such as Insulated Gate Bipolar Transistor (IGBT) is mounted on a leadframe therein, and of which the whole system thereof is molded with resin. Since such a semiconductor device produces heat during an operating state, it is common to dispose a heat sink via an insulating layer on a back side surface of the leadframe in order to cool the semiconductor device.

SUMMARY

The embodiment provides: a power module having reduced cost, reduced warpage of the whole of a substrate, stabilized quality, and improved reliability; and a fabrication method for such a power module.

According to one aspect of the embodiment, there is provided a power module comprising: an insulating layer; a metallic plate disposed on the insulating layer; a semiconductor device disposed on the metallic plate; a first adhesive insulating layer and a second adhesive insulating layer respectively disposed on the metallic plate; a metallic land for main electrode wiring disposed on the first adhesive insulating layer; and a metallic land for signal wiring disposed on the second adhesive insulating layer.

According to another aspect of the embodiment, there is provided a fabrication method for a power module comprising: forming a metallic plate; disposing a semiconductor device via a solder on a surface of the metallic plate; forming a first adhesive insulating layer and a second adhesive insulating layer on the metallic plate; forming a metallic land for main electrode wiring on the first adhesive insulating layer, and forming a metallic land for signal wiring on the second adhesive insulating layer; bonding-connecting between the semiconductor device and the metallic land for main electrode wiring via a first bonding wire; bonding-connecting between the semiconductor device and the metallic land for signal wiring via a second bonding wire; molding the metallic plate, the first adhesive insulating layer, the second adhesive insulating layer, the metallic land for main electrode wiring, the metallic land for signal wiring, the semiconductor device, the first bonding wire, and the second bonding wire using a mold resin; and forming an insulating layer on aback side surface of the metallic plate.

According to the embodiment, there can be provided a power module having reduced cost, reduced warpage of the whole of a substrate, stabilized quality, and improved reliability; and a fabrication method for such a power module.

BRIEF DESCRIPTION OF DRAWINGS

FIG. 1 is a schematic planar pattern configuration diagram of IGBT of a one-in-one (1-in-1), which is a power module according to a comparative example.

FIG. 2 is a schematic cross-sectional structure diagram taken in the line I-I of FIG. 1.

FIG. 20 is a schematic cross-sectional structure diagram showing an SiC MOSFET including a source pad electrode SP and a gate pad electrode GP, which is an example of the semiconductor device applied to the power module according to the embodiment.

FIG. 21 is a schematic cross-sectional structure diagram of the IGBT including an emitter pad electrode EP and a gate pad electrode GP, which is an example of the semiconductor device applied to the power module according to the embodiment.

DESCRIPTION OF EMBODIMENTS

Figure 3:
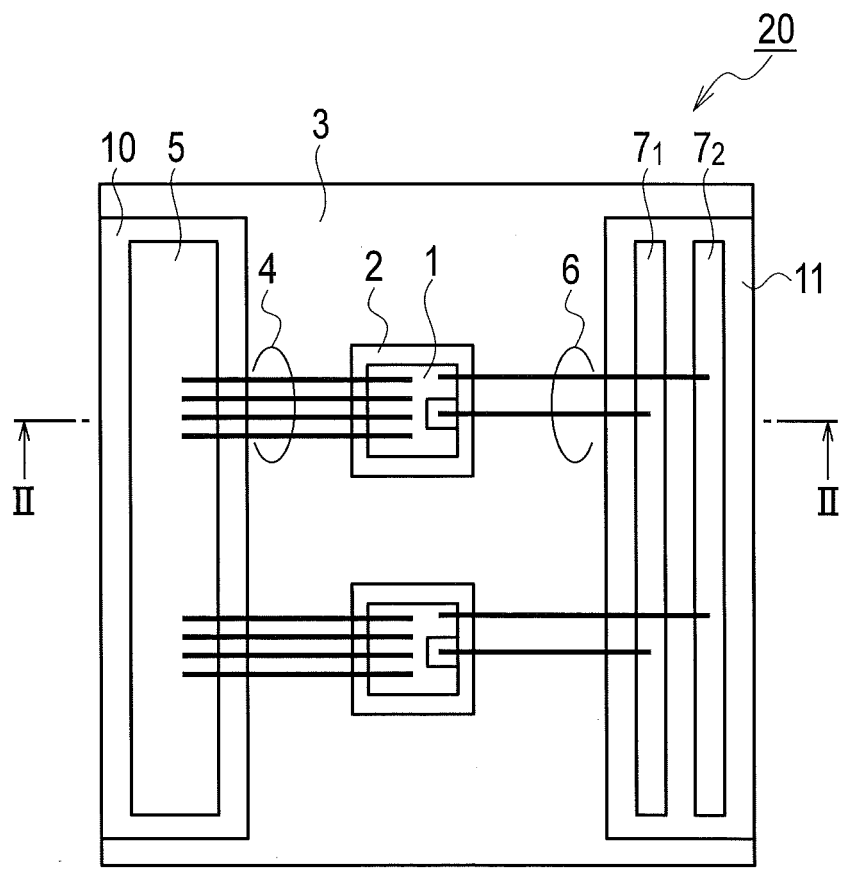
FIG. 3 is a schematic planar pattern configuration diagram of IGBT of a 1-in-1 module, which is a power module according to an embodiment.

Next, a certain embodiment will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiment described hereinafter merely exemplifies the device and method for materializing the technical idea; and the embodiment does not specify the material, shape, structure, placement, etc. of each component part as the following. The embodiment may be changed without departing from the spirit or scope of claims.

Comparative Example

FIG. 1 shows a schematic planar pattern configuration of a 1-in-1 module, which is a power module semiconductor device 2a according to a comparative example. Moreover, FIG. 2 shows a schematic cross-sectional structure taken in the line I-I of FIG. 1.

In the power module 20A according to the comparative example, a semiconductor chip 1 is connected to a collector connecting electrode 3 via solder 2 under the chip, as shown in FIGS. 1 and 2. A bonding wire 4 for emitter is connected to between an emitter electrode of the semiconductor chip 1 and a metallic land 5 for emitter wiring for the purpose of extraction of a current from an emitter of the semiconductor chip 1. Moreover, wiring (not shown) for extracting the current from the metallic land 5 for emitter wiring to the outside is constructed to the metallic land 5 for emitter wiring. Moreover, for the purpose of a current control of the semiconductor chip 1, a bonding wire $6_1$ for gate signal is connected to between a gate electrode of the semiconductor chip 1 and the metallic land $7_1$ for signal wiring, and a bonding wire $6_2$ for emitter signal is connected to between the emitter electrode of the semiconductor chip 1 and metallic land $7_2$ for emitter signal wiring.

In the embodiment, the collector connecting electrode 3, the metallic land 5 for emitter wiring, the metallic lands $7_1$, $7_2$ for signal wiring, and a back surface copper foil 9 are respectively bonded to a ceramics substrate 8. Such a structure can be formed by process insulating substrates, e.g. commercially available Direct Bonding Copper (DBC), for example.

The power module 20A according to the comparative example requires a high cost since it is necessary to request fabrication of the insulating substrate to insulating substrate manufacturers. Moreover, if various circuit patterns are required, a substrate template for every circuit pattern is required, thereby taking a high cost. Moreover, warpage may occur in the insulating substrate due to a coefficient thermal expansion (CTE) difference between the ceramics substrate and the copper circuit pattern.

Embodiment

—One-in-One Module (1-in-1 Module)—

FIG. 3 is a schematic planar pattern configuration of IGBT of a 1-in-1 module, which is a power module 20 according to an embodiment. Moreover, FIG. 4 shows a schematic cross-sectional structure taken in the line II-II of FIG. 3.

Figure 4:
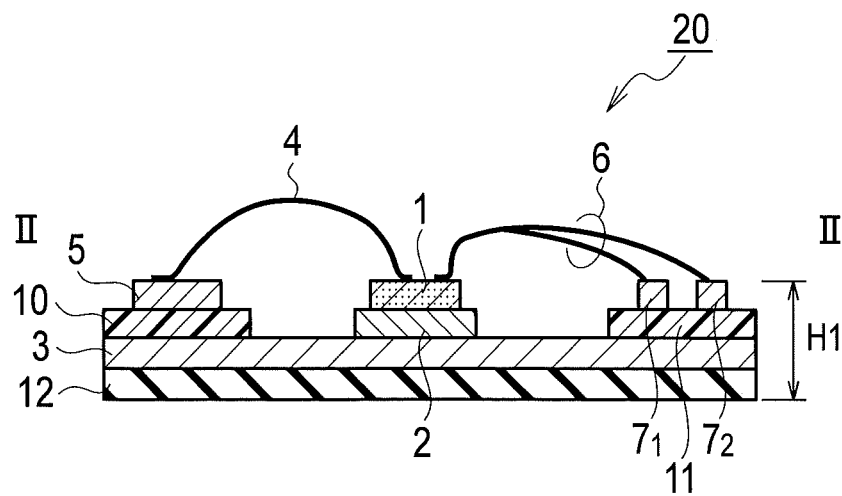
FIG. 4 is a schematic cross-sectional structure diagram taken in the line II-II of FIG. 3.

As shown in FIGS. 3 and 4, the power module 20 according to the embodiment includes: an insulating layer 12; a metallic plate 3 disposed on the insulating layer 12; a semiconductor device 1 disposed on the metallic plate 3; a first adhesive insulating layer 10 and a second adhesive insulating layer 11 respectively disposed on the metallic plate 3; a metallic land 5 for main electrode wiring disposed on the first adhesive insulating layer 10; and metallic lands $7_1$, $7_2$ for signal wiring disposed on the second adhesive insulating layer 11.

As shown in FIGS. 3 and 4, in the power module 20 according to the embodiment, the metallic land 5 for main electrode wiring and the metallic lands $7_1$, $7_2$ for signal wiring are formed on the metallic plate 3 having a wiring pattern on which the semiconductor device 1 is mounted via the first and second adhesive insulating layers (10, 11). The metallic lands 5, $7_1$ and $7_2$ have wiring patterns other than the wiring pattern on the metallic plate 3.

The first adhesive insulating layer 10 and the second adhesive insulating layer 11 are formed with an inorganic adhesive agent, in the power module 20 according to the embodiment.

In the embodiment, the inorganic adhesive agent contains a filler, and the filler may be one selected from the group consisting of silica, alumina, zirconia, and a complex thereof, for example.

The metallic plate 3 can be formed of one selected from the group consist of copper, aluminum (aluminium), a copper alloy and an aluminum alloy (aluminium alloy).

As shown in FIGS. 3 and 4, the power module 20 according to the embodiment includes: a first bonding wire 4 configured to electrically connect between the semiconductor device 1 and the metallic land 5 for main electrode wiring; a second bonding wire 6 configured to electrically connect between the semiconductor device 1 and the metallic lands $7_1$, $7_2$ for signal wiring; and a mold resin (17: refer to FIGS. 11 and 12) for molding the metallic plate, the first and second adhesive insulating layers, the metallic land for main electrode wiring, the metallic land for signal wiring, the semiconductor device, and the first and second bonding wires.

Modified Example

Figure 5:
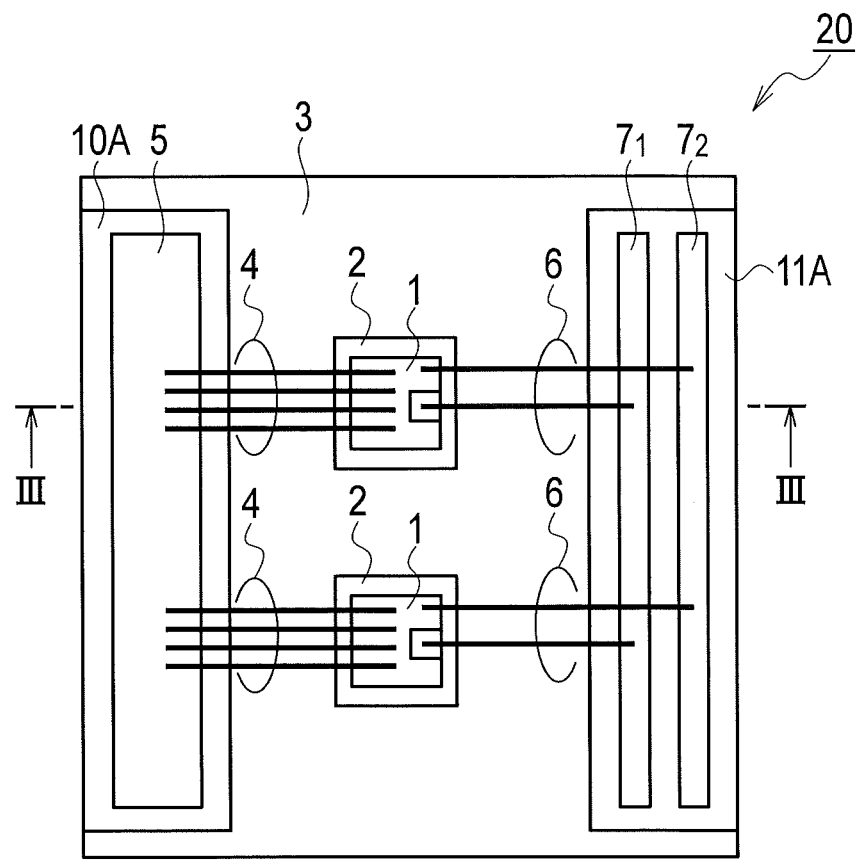
FIG. 5 is a schematic planar pattern configuration diagram of IGBT of a 1-in-1 module, which is a power module according to a modified example of the embodiment.

FIG. 5 is a schematic planar pattern configuration of IGBT of a 1-in-1 module, which is a power module 20 according to a modified example of the embodiment. Moreover, FIG. 6 shows a schematic cross-sectional structure taken in the line of FIG. 5.

Figure 6:
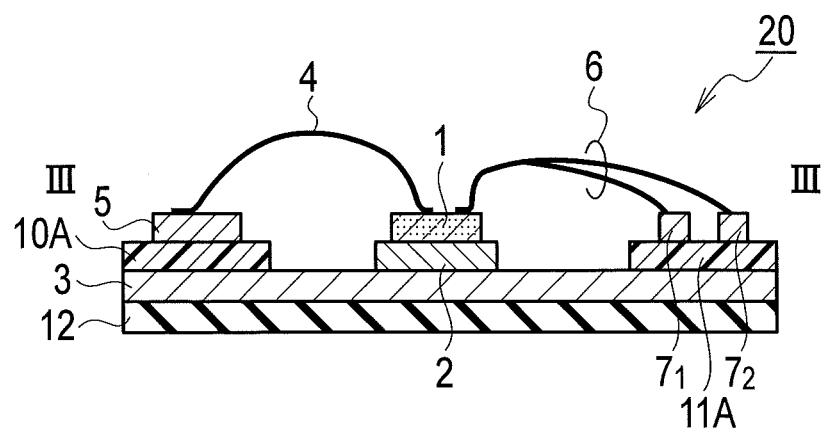
FIG. 6 is a schematic cross-sectional structure diagram taken in the line III-III of FIG. 5.

As shown in FIGS. 5 and 6, each of the first adhesive insulating layer 10A and the second adhesive insulating layer 11A is formed of a heat-resistant insulating sheet, in the power module 20 according to the modified example of the embodiment.

In the embodiment, the heat-resistant insulating sheet may be formed of one selected from the group consist of an epoxy based resin and a polyimide based resin, for example. In the present embodiment, the thickness of the heat-resistant insulating sheet is approximately 30 μm to approximately 120 μm, for example, and therefore the heat-resistant insulating sheet is relatively thin as one layer. Accordingly, the heat-resistant insulating sheet may be formed of a multilayered sheet.

Figure 7:
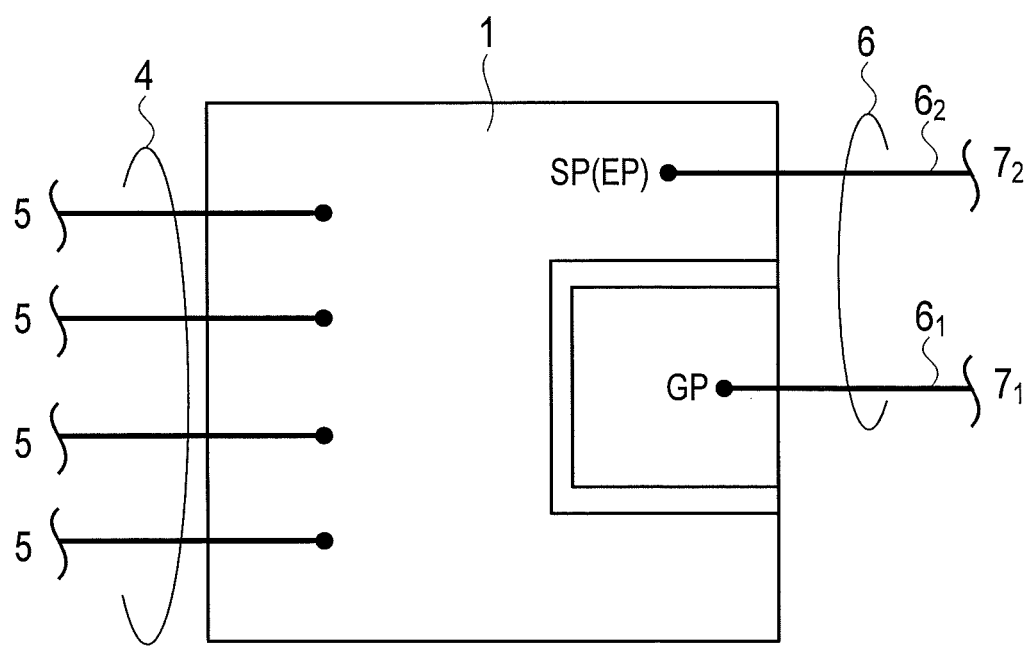
FIG. 7 is an enlarged schematic planar pattern configuration diagram showing a surface portion of a semiconductor device applied to the power modules according to the embodiment and its modified example.

FIG. 7 shows an enlarged schematic planar pattern configuration of a surface portion of a semiconductor device 1 applied to the power modules 20 according to the embodiment and its modified example.

As shown in FIG. 7, a source pad electrode SP or an emitter pad electrode EP, and a gate pad electrode GP are disposed on the surface of the semiconductor device 1. The first bonding wire 4 electrically connected to the metallic land 5 for main electrode wiring and the second bonding wire $6_2$ connected to the metallic land $7_2$ for signal wiring are connected onto the source pad electrode SP or emitter pad electrode EP. Moreover, the first bonding wire $6_1$ connected to the metallic land $7_1$ for signal wiring is connected onto the gate pad electrode GP. In the embodiment, the emitter pad electrode EP is formed on the surface of the semiconductor device 1 if the semiconductor device 1 is IGBT, but the source pad electrode SP is formed on the surface of the semiconductor device 1 if the semiconductor device 1 is SiC MOSFET.

Fabrication Method

Figure 8A:
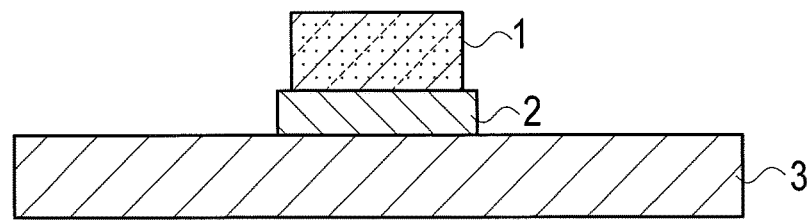
FIG. 8A is a cross-sectional diagram showing a state where a semiconductor device 1 is bonded on a collector connecting electrode 3, in a process chart showing a fabrication method of the power module according to the embodiment.
Figure 8B:
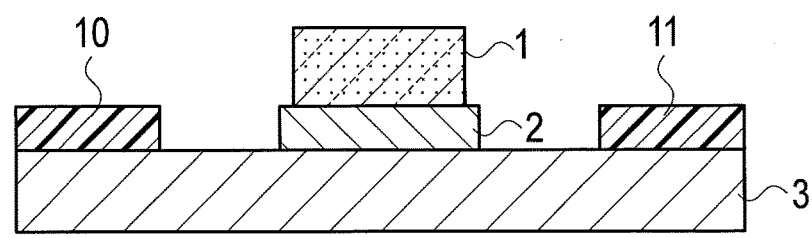
FIG. 8B is a cross-sectional diagram showing a state after disposing an adhesive insulating layer 10 for emitter and an adhesive insulating layer 11 for signal wiring on the collector connecting electrode 3, in the process chart showing the fabrication method of the power module according to the embodiment.
Figure 8C:
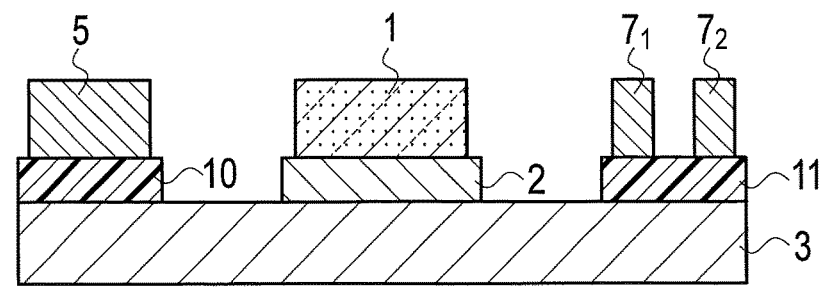
FIG. 8C is a cross-sectional diagram showing a state where a metallic land 5 for emitter wiring and metallic lands $7_1$, $7_2$ for signal wiring are mounted on the adhesive insulating layer 10 for emitter and the adhesive insulating layer 11 for signal wiring, and then a heating and pressurizing process is performed, in the process chart showing the fabrication method of the power module according to the embodiment.

FIG. 8A shows a cross-sectional structure showing a state where the semiconductor device 1 is bonded via solder 2 under the chip on the metallic plate (collector connecting electrode) 3, in a process chart showing a fabrication method of the power module 20 according to the embodiment. Moreover, FIG. 8B shows a cross-sectional structure showing a state after disposing the adhesive insulating layer 10 for emitter and the adhesive insulating layer 11 for signal wiring on the collector connecting electrode 3. Moreover, FIG. 8C shows a cross-sectional structure showing a state where the metallic land 5 for emitter wiring is mounted on the adhesive insulating layer 10 for emitter and the metallic lands $7_1$, $7_2$ for signal wiring are mounted on the adhesive insulating layer 11 for signal wiring, and then a heating and pressurizing process is performed. Moreover, FIG. 8D shows a cross-sectional structure showing a state where the semiconductor device 1 and the metallic land 5 for emitter wiring are bonding-connected via the bonding wire 4 for emitter, and the semiconductor device 1 and the metallic lands $7_1$, $7_2$ for signal wiring are respectively bonding-connected via the bonding wires 6 ($6_1$, $6_2$) for signal.

Figure 9:
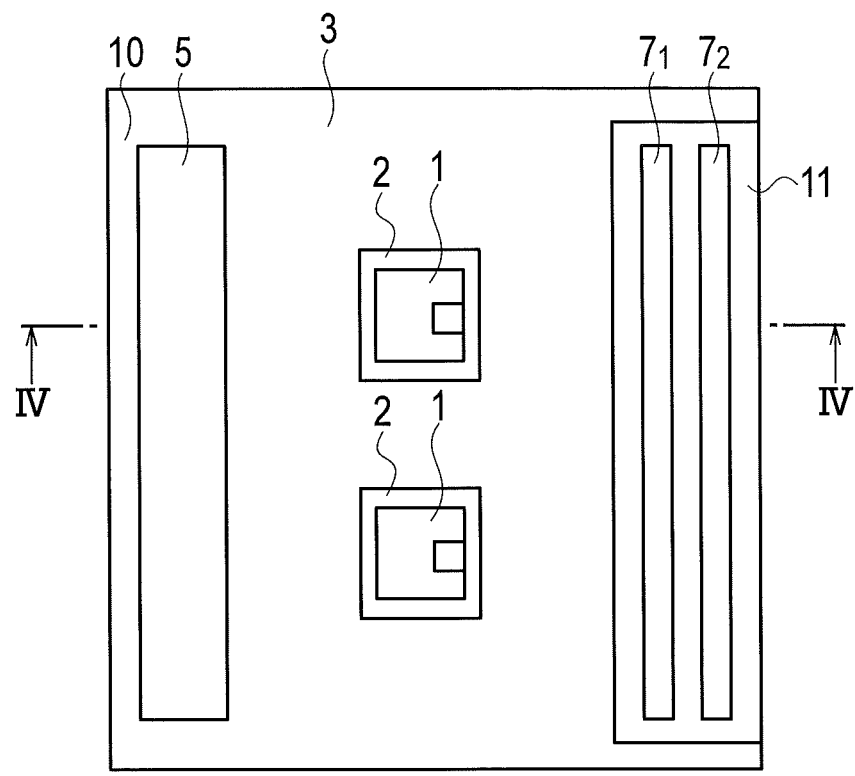
FIG. 9 is a schematic planar pattern configuration diagram showing a state where the metallic land 5 for emitter wiring and the metallic lands $7_1$, $7_2$ for signal wiring are mounted on the adhesive insulating layer 10 for emitter and the adhesive insulating layer 11 for signal wiring, in the process chart showing the fabrication method of the power module according to the embodiment.

Furthermore, in the process chart showing the fabrication method of the power module 20 according to the embodiment, FIG. 9 shows a schematic planar pattern configuration in a state where the metallic land 5 for emitter wiring is mounted on the adhesive insulating layer 10 for emitter, and the metallic lands $7_1$, $7_2$ for signal wiring are mounted on the adhesive insulating layer 11 for signal wiring.

Figure 10:
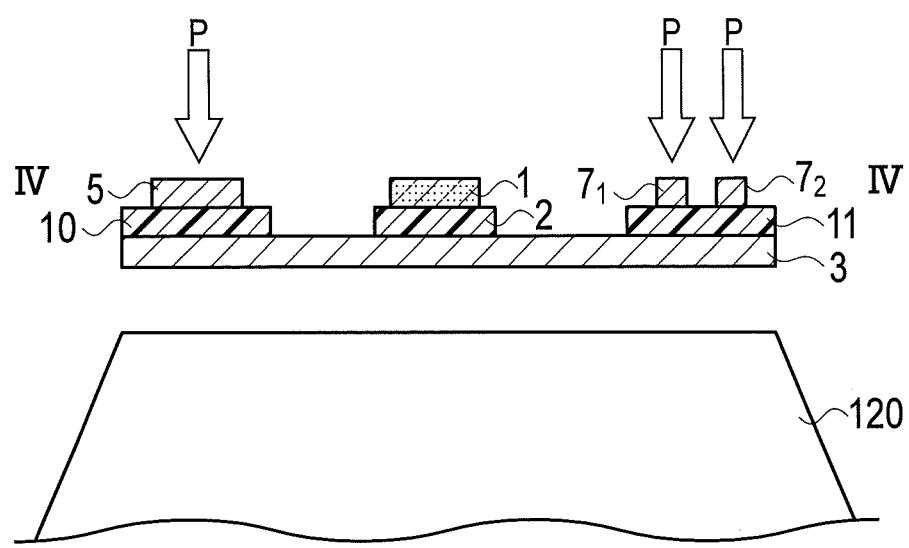
FIG. 10 is a schematic cross-sectional structure diagram taken in the line IV-IV of FIG. 9, in a state where the metallic land 5 for emitter wiring and the metallic lands $7_1$, $7_2$ for signal wiring are bonded on the adhesive insulating layer 10 for emitter and the adhesive insulating layer 11 for signal wiring with a heating and pressurizing process, in the process chart showing the fabrication method of the power module according to the embodiment.

Moreover, in the process chart showing the fabrication method of the power module 20 according to the embodiment, FIG. 10 shows a schematic cross-sectional structure taken in the line IV-IV of FIG. 9, in a state where the metallic land 5 for emitter wiring is bonded onto the adhesive insulating layer 10 for emitter, and the metallic lands $7_1$, $7_2$ for signal wiring are bonded onto the adhesive insulating layer 11 for signal wiring, with a heating and pressurizing process. A hot plate 120 is applicable as a heating method. A thermostatic oven, a hot air dryer, etc. may also be used therefor. Heating processing temperature is approximately 100 degrees C. to approximately 200 degrees C., for example. Pressurizing pressure P is approximately 20 kg/cm$^2$, for example.

Figure 8D:
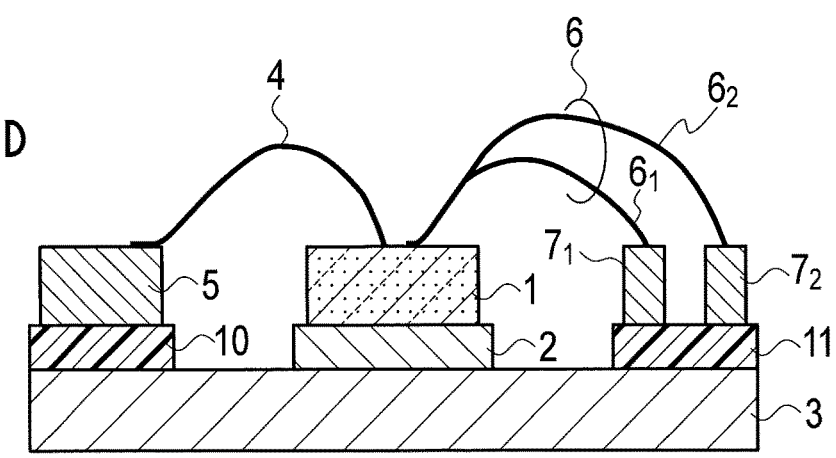
FIG. 8D is a cross-sectional diagram showing a state where a bonding wire 4 for emitter and bonding wires 6 ($6_1$, $6_2$) for signal are bonding-connected thereto, in the process chart showing the fabrication method of the power module according to the embodiment.
Figure 12:
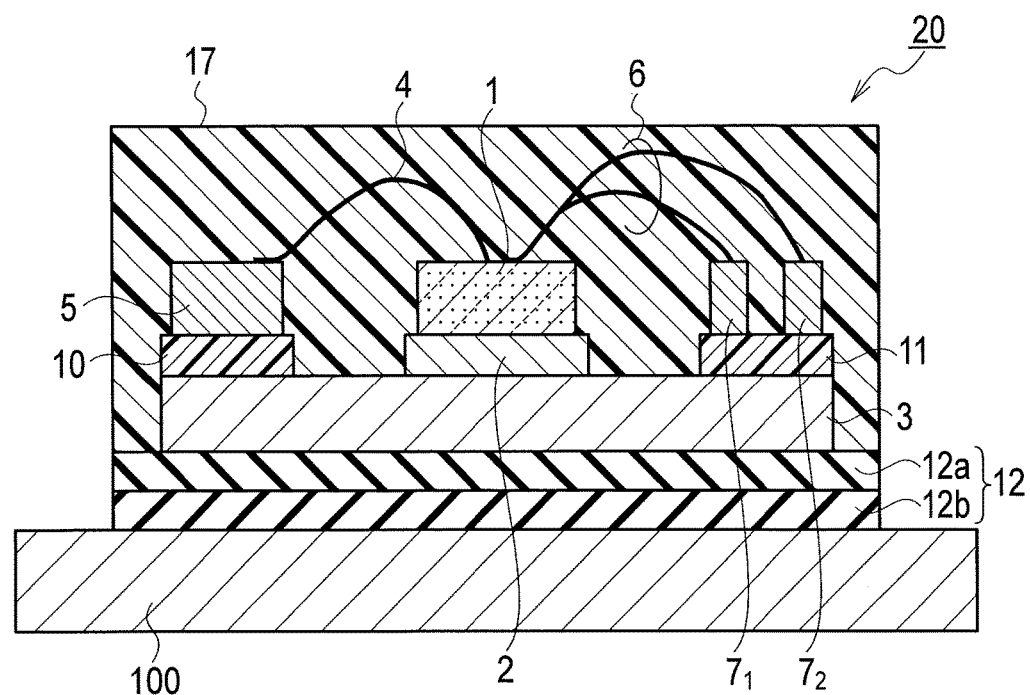
FIG. 12 is a cross-sectional diagram showing a state where a relatively-hard insulating layer and a relatively-soft insulating layer formed on the back side surface of the collector connecting electrode 3 subjected to molding are disposed on a heat sink, in the process chart showing the fabrication method of the power module according to the embodiment.

Moreover, in the process chart showing the fabrication method of the power module 20 according to the embodiment, FIG. 12 shows a cross-sectional structure showing a state where a relatively-hard insulating layer 12a and a relatively-soft insulating layer 12b already formed on the back side surface of the collector connecting electrode 3 already subjected to molding using a mold resin 17 are disposed on the heat sink 100, after the bonding process shown in FIG. 8D.

Moreover, in the process chart showing the fabrication method of the power module 20 according to the embodiment, FIG. 12 shows a cross-sectional structure showing a state where a relatively-hard insulating layer 12a and a relatively-soft insulating layer 12b already formed on the back side surface of the collector connecting electrode 3 already subjected to molding using a mold resin 17 are disposed on the heat sink 100, after the bonding process shown in FIG. 8D.

As shown in FIGS. 8A-8D and 9-12, the fabrication method of the power module 20 according to the embodiment includes: forming a metallic plate 3; disposing a semiconductor device 1 via solder 2 under the chip on the surface of the metallic plate 3; forming a first adhesive insulating layer 10 and a second adhesive insulating layer 11 on the metallic plate 3; forming a metallic land 5 for main electrode wiring on the first adhesive insulating layer 10, and forming metallic lands $7_1$, $7_2$ for signal wiring on the second adhesive insulating layer 11; bonding-connecting between the semiconductor device 1 and the metallic land 5 for main electrode wiring via a first bonding wire 4; bonding-connecting between the semiconductor device 1 and the metallic lands $7_1$, $7_2$ for signal wiring via bonding wires 6 ($6_1$, $6_2$); molding the metallic plate 3, the first adhesive insulating layer 10, the second adhesive insulating layer 11, the metallic land 5 for main electrode wiring, the metallic lands $7_1$, $7_2$ for signal wiring, the semiconductor device 1, the first bonding wire 4, and the second bonding wires 6 ($6_1$, $6_2$) using a mold resin 17; and forming an insulating layer 12 on a back side surface of the metallic plate 3.

In the embodiment, the step of forming the insulating layer 12 on the back side surface of the metallic plate 3 may include: forming a relatively-hard insulating layer 12a on the back side surface of the metallic plate 3; and forming a relatively-soft insulating layer 12b on the relatively-hard insulating layer 12a.

Moreover, the step of forming the metallic land 5 for main electrode wiring on the first adhesive insulating layer 10 and forming the metallic lands $7_1$, $7_2$ for signal wiring on the second adhesive insulating layer 11 includes a heating and pressurizing process.

Moreover, the first adhesive insulating layer 10 and the second adhesive insulating layer 11 can be formed of an inorganic adhesive agent, and may be formed at both opposite edge sides of the metallic plate so as to sandwich the semiconductor device.

Moreover, the inorganic adhesive agent contains a filler, and the filler may be silica, alumina, zirconia, or a complex thereof, for example.

Hereinafter, the fabrication method of the power module 20 according to the embodiment will now be explained in detail.

(a) Firstly, as shown in FIG. 8A, the semiconductor device 1 is bonded, with solder 2 under the chip, onto the surface of the desired-sized metallic plate 3 including copper or copper alloy. As material(s) of the metallic plate 3 used herein, aluminum (aluminium) or an aluminum alloy (aluminium alloy) as well as copper or a copper alloy may be used. When using copper or a copper alloy, copper or a copper alloy may be used as it is; or nickel plating, silver plating, or gold plating may be applied for preventing oxidation of the metallic plate 3. When using (aluminium) or an aluminum alloy (aluminium alloy), no extra plating process is required if a solder material for aluminum (aluminium) is used. However, when not using such a solder material for aluminum, it is required to apply nickel plating, silver plating, gold plating, etc.

(b) Next, as shown in FIG. 8B, the first adhesive insulating layer 10 and the second adhesive insulating layer 11 which are composed of an inorganic adhesive agent are coated to the surface of the metallic plate 3 which is already bonded to the semiconductor device 1 using the solder 2 under the chip. As the inorganic adhesive agent used herein, an inorganic adhesive agent of which the volume specific resistivity is equal to or greater than $1 \times 10^6$ Ω·cm may be used in the light of an insulating breakdown voltage performance of the power module. Moreover, as an inorganic filler contained in such an inorganic adhesive agent, it is preferred to use silica, alumina, zirconia, or a complex of such fillers. Moreover, the thickness of such an inorganic adhesive agent may be approximately 10 μm to approximately 1 mm, for example. It is difficult for an inorganic adhesive agent of which the thick is equal to or less than approximately 10 μm to hold an insulating breakdown voltage. Moreover, it is difficult to apply an inorganic adhesive agent of which the thick is equal to or greater than approximately 1 mm since it takes much time to be cured. The thickness of the inorganic adhesive agent may preferably be approximately 200 μm to approximately 500 μm, for example.

In the embodiment, the step of forming the inorganic adhesive agent is as follows.

(b-1) The inorganic adhesive agent is coated on the metallic plate 3, and then is naturally dried for approximately one day.

(b-2) Next, it is heated from a room temperature to approximately 40 degrees C. for one day.

(b-3) Next, it is heated to approximately 100 degrees C. for approximately four hours, for example, to be subjected to curing treatment.

The inorganic adhesive agent can be formed voidlessly through the above-mentioned steps.

(c) Next, as shown in FIGS. 8C and 9-10, the metallic land 5 for emitter wiring and the metallic lands $7_1$, $7_2$ for signal wiring which are formed in desired sizes are mounted on the adhesive insulating layer 10 for emitter and the adhesive insulating layer 11 for signal wiring, to be subjected to pressurization/heating and curing. A hot plate 120 is applicable as a heating method. A thermostatic oven, a hot air dryer, etc. may also be used therefor. Heating processing temperature is approximately 100 degrees C. to approximately 200 degrees C., for example. Moreover, the pressurizing pressure P is approximately 20 kg/cm$^2$, for example.

(d) Next, as shown in FIG. 8D, between the semiconductor device 1 and the metallic land 5 for emitter wiring are connected using an aluminum wire (a bonding wire 4 for emitter), and between the semiconductor device 1 and the metallic lands $7_1$, $7_2$ for signal wiring are respectively connected using aluminum wires (bonding wires $6_1$, $6_2$ for signal).

Figure 11:
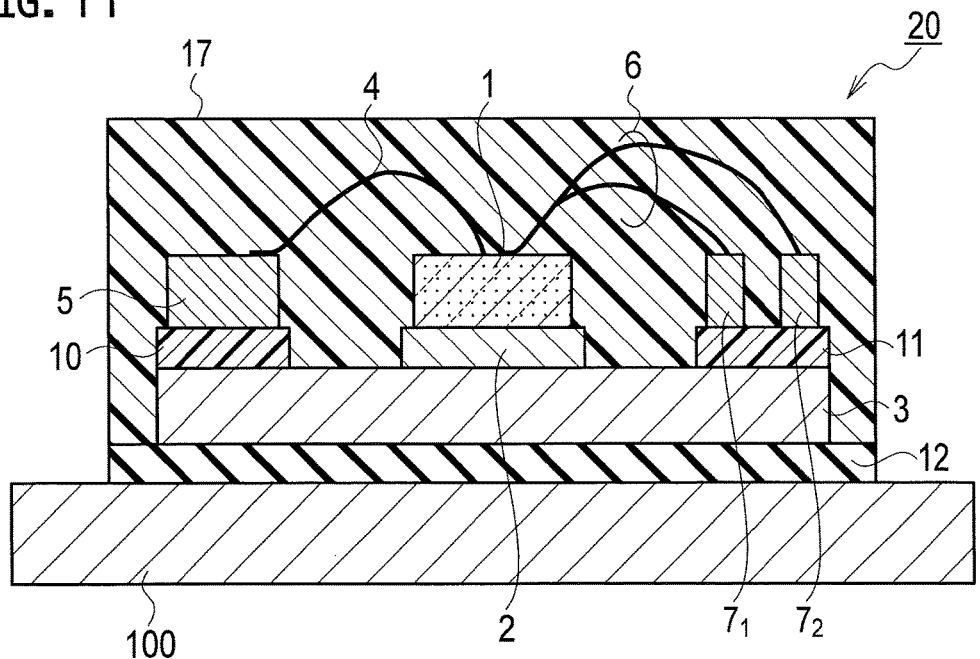
FIG. 11 is a cross-sectional diagram showing a state where an insulating layer formed on a back side surface of the collector connecting electrode 3 subjected to molding is disposed on a heat sink, in the process chart showing the fabrication method of the power module according to the embodiment.

(e) Next, as shown in FIG. 11, molding is performed using the mold resin 17.

(f) Next, as shown in FIG. 11, the insulating layer 12 is formed on the back side surface of the collector connecting electrode 3, and then is mounted on the heat sink 100. In this point, the relatively-hard insulating layer 12a and the relatively-soft insulating layer 12b may be formed on the back side surface of the collector connecting electrode 3, and then may be mounted on the heat sink 100.

The power module 20 according to the embodiment as shown in FIGS. 11 and 12 is completed through the above-mentioned fabricating process.

In the power module 20 according to the embodiment, there is no need of fabricating a substrate template for newly fabricating the insulating substrate even if the number of the semiconductor devices 1 to be mounted or disposition of the semiconductor devices is changed, since a shape of the metallic land 5 for emitter wiring or the metallic lands $7_1$, $7_2$ for signal wiring can be appropriately changed in accordance therewith, and then can be fixed to the metallic plate (collector connecting electrode) 3 using the inorganic adhesive agent.

Moreover, the insulating layer 12 may be formed of an organic insulating resin layer.

Alternatively, the power module 20 according to the embodiment may include a cooling plate (heat sink) 100 as shown in FIGS. 11 and 12, and the insulating layer 12 may be disposed at the cooling plate side.

Alternatively, in the power module 20 according to the embodiment, as shown in FIG. 12, the insulating layer 12 includes: a relatively-hard insulating layer 12a disposed at a metallic plate 3 side; and a relatively-soft insulating layer 12b disposed at a side opposite to the metallic plate 3 side.

Alternatively, as shown in FIG. 12, the power module 20 according to the embodiment may include a cooling plate (heat sink) 100, and the relatively-soft insulating layer 12b may be disposed at the cooling plate (heat sink) 100 side.

In the embodiment, the relatively-soft insulating layer 12b may be formed of an organic material(s).

Moreover, the relatively-soft insulating layer 12b may be formed of a silicone based resin(s).

Moreover, the relatively-soft insulating layer 12b may be filled up with a high thermally-conductive filler.

In the embodiment, the filler with which the relatively-soft insulating layer 12b is filled up may be at least one selected from the group consist of aluminium oxide, silicon oxide, aluminum nitride, silicon nitride, boron nitride, beryllia, and magnesia.

Similarly, the relatively-hard insulating layer 12a may also be formed of an organic material(s).

Moreover, the relatively-hard insulating layer 12a may be formed of at least one selected from the group consist of an epoxy based resin, an urethane system resin, an acrylic resin, and a silicone based resin.

Moreover, the relatively-hard insulating layer 12a may be filled up with a high thermally-conductive filler.

In the embodiment, the filler with which the relatively-hard insulating layer 12a is filled up may be at least one selected from the group consist of aluminium oxide, silicon oxide, aluminum nitride, silicon nitride, boron nitride, beryllia, and magnesia.

The thickness of the power module 20 according to the embodiment molded with the mold resin 17 except the heat sink 100 can be thinly formed, e.g., approximately 7 mm.

Each of the configurations shown in FIGS. 8A-8D and 9-12 corresponds to the fabrication method of the power module having the 1-in-1 configuration.

Figure 13:
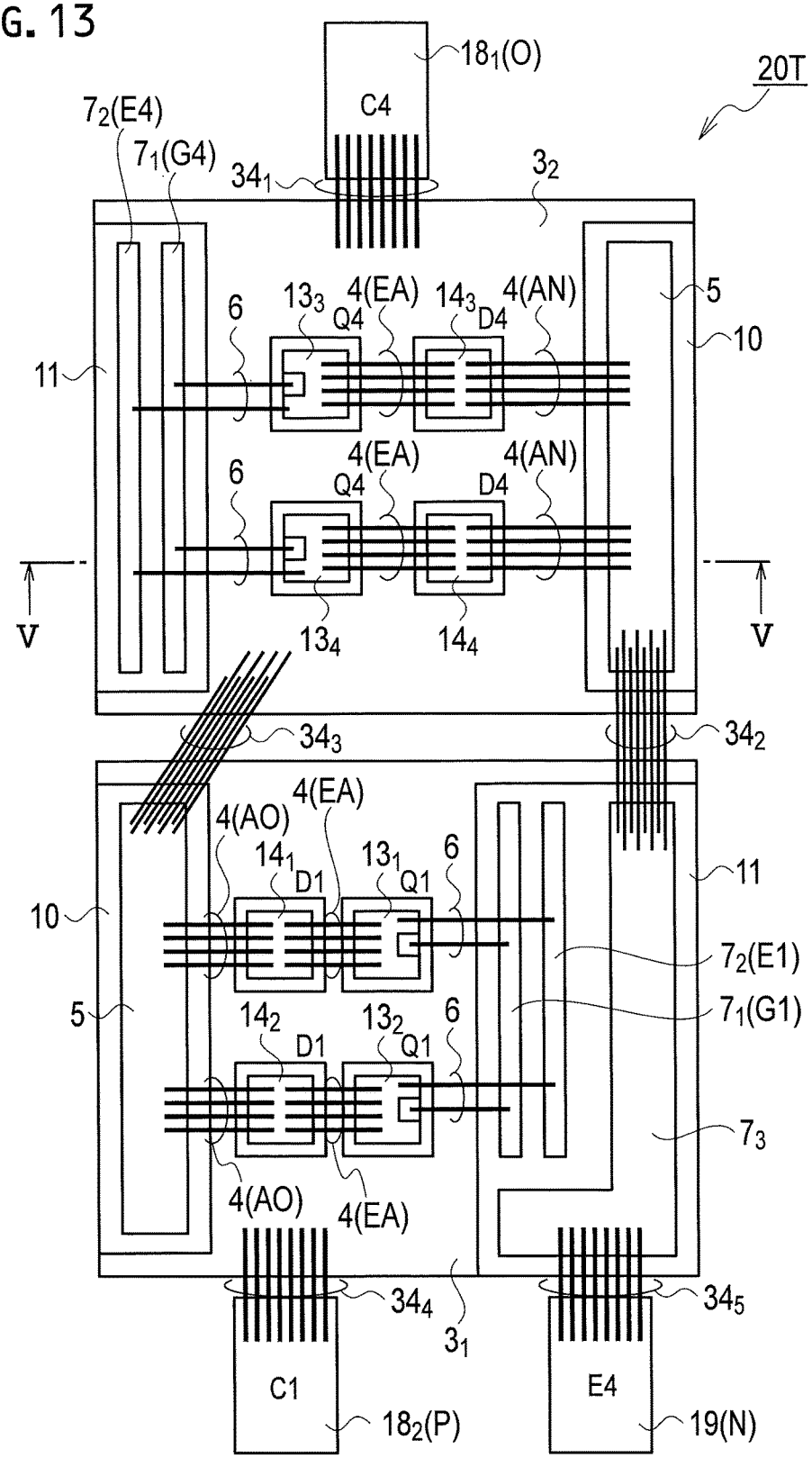
FIG. 13 is a schematic planar pattern configuration diagram of IGBT of a two-in-one (2-in-1) module, which is the power module according to the embodiment.
Figure 14:
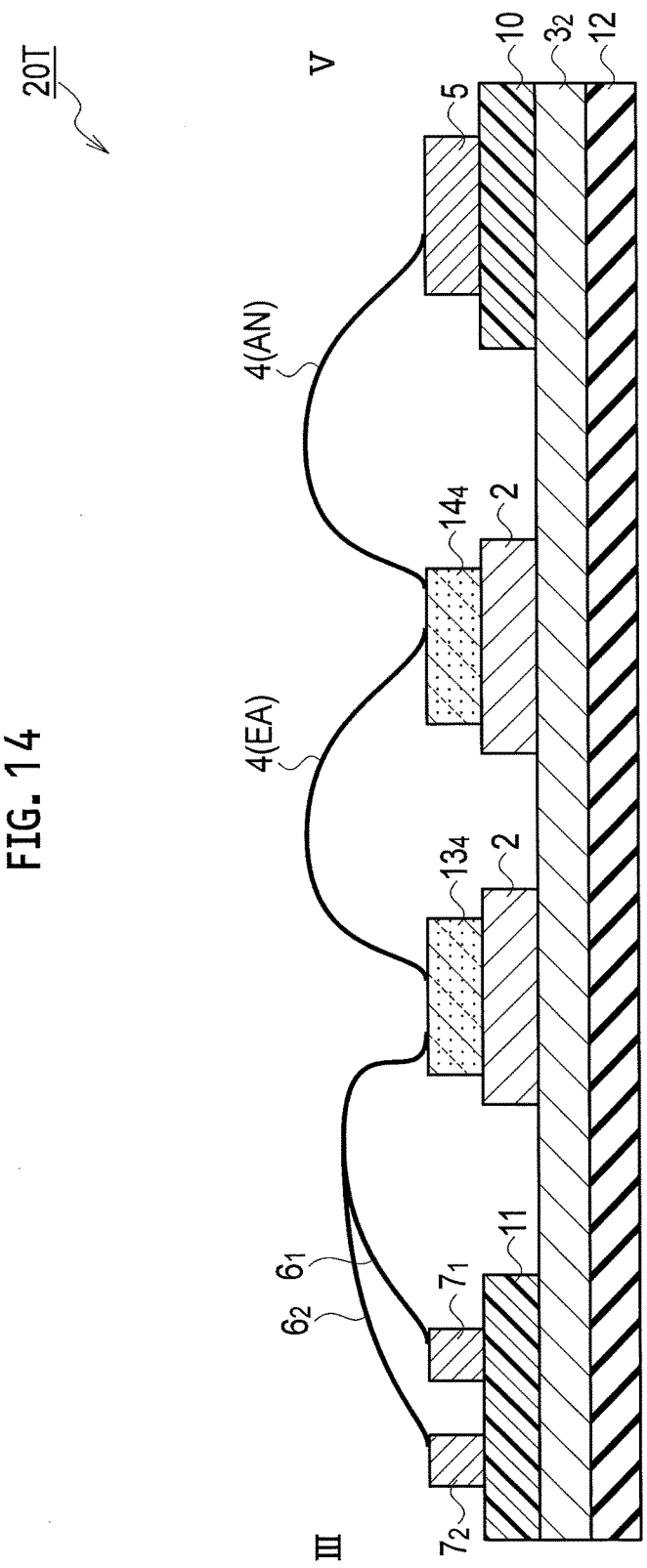
FIG. 14 is a schematic cross-sectional structure diagram taken in the line V-V of FIG. 13.
Figure 15:
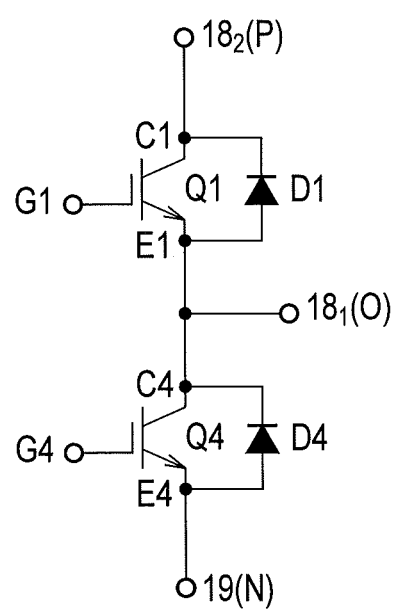
FIG. 15 is a schematic circuit representative diagram of the IGBT of 2-in-1 module corresponding to FIG. 13, which is the power module according to the embodiment.

The fabrication method of the power module 20 according to the embodiment explained herein is also similarly applicable to a power module 20T according to the embodiment having a 2-in-1 configuration provided with a plurality of the metallic plates $3_1$, $3_2$ as shown in FIGS. 13-15 mentioned below.

—Two-in-One Module (2-in-1 Module)—

FIG. 13 shows a schematic planar structure of a power module 20T according to the embodiment (after the semiconductor chips are mounted). Moreover, FIG. 14 shows a schematic cross-sectional structure taken in the line V-V of FIG. 13. Each of the configurations shown in FIGS. 13 and 14 corresponds to a power module having a 2-in-1 configuration.

As shown in FIGS. 13 and 14, a flywheel diode $14_4$ and an IGBT $13_4$ are respectively disposed, via solders 2 under the chip, on a metallic plate $3_2$ connected to a leadframe (upper arm) $18_1$ (O). Moreover, a first adhesive insulating layer 10 and a second adhesive insulating layer 11 are respectively disposed on the metallic plate $3_2$, a metallic land 5 for main electrode wiring is further disposed on the first adhesive insulating layer 10, and metallic lands $7_1$, $7_2$ for signal wiring are further disposed on the second adhesive insulating layer 11. Moreover, a bonding wire 4 (EA) connects between an emitter E4 of the IGBT (Q4) $13_4$, and an anode A4 of the flywheel diode (D4) $14_4$. A bonding wire 4 (AN) connects between the anode A4 of the flywheel diode (D4) $14_4$, and the metallic land 5 for main electrode wiring. A bonding wire 6 ($6_1$) connects between a gate G4 of the IGBT (Q4) $13_4$ and the metallic land $7_1$ for signal wiring and a bonding wires 6 ($6_2$) connects between an emitter E4 of the IGBT (Q4) $13_4$, and the metallic land $7_2$ for signal wiring.

Moreover, FIG. 15 shows a schematic circuit representation of the 2-in-1 module corresponding to FIG. 13, which is the power module 20T according to the embodiment to which the IGBT is applied as the semiconductor device. As shown in FIG. 15, two IGBTs Q1, Q4 are built in one module. Reference numeral G1 denotes a gate signal terminal of the IGBT Q1, and reference numeral E1 denotes an emitter terminal of the IGBT Q1. Reference numeral C1 denotes a collector terminal of the IGBT Q1. Reference numeral G4 denotes a gate signal terminal of the IGBT Q4, reference numeral E4 is an emitter terminal of the IGBT Q4, and reference numeral C4 denotes a collector terminal of the IGBT Q4. The collector terminal C1 of the IGBT Q1 is connected to the leadframe (upper arm) $18_2$ (P). The emitter terminal E1 of the IGBT Q1 and the collector terminal C4 of the IGBT Q4 are connected to the leadframe (lower arm) $18_1$ (O). The emitter terminal E4 of the IGBT Q4 is connected to a leadframe 19 (N). Reference numeral P denotes a positive side power input terminal, reference numeral N denotes a negative side power input terminal, and reference numeral O denotes an output terminal.

The collector terminal C1 of the IGBT Q1 is connected to a collector connecting electrode $3_1$, and is connected to the leadframe (upper arm) $18_2$ (P) via a bonding wire $34_4$. The emitter terminal E1 of the IGBT Q1 and the collector terminal C4 of the IGBT Q4 are connected to the collector connecting electrode $3_2$, and are connected to the leadframe (lower arm) $18_1$ (O) via a bonding wire $34_1$. The emitter terminal E4 of the IGBT Q4 is connected to the leadframe 19 (N) via the anode terminal A4 of the flywheel diode D4 and bonding wires 4 (AN), $34_2$, $34_5$.

As shown in FIGS. 13-15, the power module 20T according to the embodiment includes: an insulating layer(s) 12; metallic plates $3_1$, $3_2$ disposed on the insulating layer(s) 12; a semiconductor device (IGBTs $13_1$, $13_2$, and flywheel diodes $14_1$, $14_2$) disposed on the metallic plate $3_1$; a semiconductor device (IGBTs $13_3$, $13_4$, and flywheel diodes $14_3$, $14_4$) disposed on the metallic plate $3_2$; first adhesive insulating layers 10 and second adhesive insulating layers 11 respectively disposed on the metallic plates $3_1$, $3_2$; metallic lands 5 for main electrode wiring respectively disposed on the first adhesive insulating layers 10; and metallic lands $7_1$, $7_2$ for signal wiring respectively disposed on the second adhesive insulating layers 11, and a metallic land $7_3$ for power wiring disposed on the second adhesive insulating layer 11.

As shown in FIGS. 13-15, in the power module 20T according to the embodiment, the metallic land 5 for main electrode wiring and the metallic lands $7_1$, $7_2$ for signal wiring having other wiring patterns via the adhesive insulating layers (10, 11) are formed on the metallic plate $3_1$ having a wiring pattern on which the semiconductor device (IGBT $13_1$, $13_2$, and flywheel diodes $14_1$, $14_2$) is mounted. Similarly, the metallic land 5 for main electrode wiring and the metallic lands $7_1$, $7_2$ for signal wiring having other wiring patterns via the adhesive insulating layers (10, 11) are formed on the metallic plate $3_2$ having a wiring pattern on which the semiconductor device (IGBT $13_3$, $13_4$, and flywheel diodes $14_3$, $14_4$) is mounted.

Also in the power module 20T according to the embodiment, the first adhesive insulating layer 10 and the second adhesive insulating layer 11 are formed of an inorganic adhesive agent.

In the embodiment, the inorganic adhesive agent contains a filler, and the filler may be silica, alumina, zirconia, or a complex thereof, for example.

The metallic plates $3_1$, $3_2$ can be formed of one selected from the group consist of copper, aluminum (aluminium), a copper alloy and an aluminum alloy (aluminium alloy).

As shown in FIGS. 13-15, the power module 20T according to the embodiment includes: bonding wires 4 (AN) configured to electrically connect respectively between the flywheel diodes $14_3$, $14_4$ and the metallic land 5 for main electrode wiring; bonding wires 4 (EA) configured to electrically connect respectively between the IGBTs $13_3$, $13_4$ and the flywheel diodes $14_3$, $14_4$; bonding wires 6 configured to electrically connect respectively between the IGBTs $13_3$, $13_4$ and the metallic lands $7_1$, $7_2$ for signal wiring; bonding wires 4 (AO) configured to electrically connect respectively between the flywheel diodes $14_1$, $14_2$ and the metallic land 5 for main electrode wiring; bonding wires 4 (EA) configured to electrically connect respectively between the IGBTs $13_1$, $13_2$ and the flywheel diodes $14_1$, $14_1$; bonding wire 6 configured to electrically connect respectively between the IGBTs $13_1$, $13_2$ and the metallic lands $7_1$, $7_2$ for signal wiring; a bonding wire $34_1$ configured to connect between the leadframe (lower arm) $18_1$ (O) and the metallic plate $3_2$; a bonding wire $34_2$ configured to connect between the metallic land 5 for main electrode wiring and the metallic land $7_3$ for power wiring; a bonding wire $34_3$ configured to connect between the metallic plate $3_2$ and the metallic land 5 for main electrode wiring; a bonding wire $34_4$ configured to connect between the leadframe (upper arm) $18_2$ (P) and the metallic plate $3_1$; and a bonding wire $34_5$ configured to connect the leadframe 19 (N) and the metallic land for power wiring $7_3$.

The first adhesive insulating layer 10 and the second adhesive insulating layer 11 in the power module 20T may be formed of the heat-resistant insulating sheet in the same manner as the power module 20 according to the modified example of the embodiment shown in FIGS. 5 and 6.

In the embodiment, the heat-resistant insulating sheet may be formed of one selected from the group consist of an epoxy based resin and a polyimide based resin, for example.

In the present embodiment, the thickness of the heat-resistant insulating sheet is approximately 30 μm to approximately 120 μm, for example, and therefore the heat-resistant insulating sheet is relatively thin as one layer. Accordingly, the heat-resistant insulating sheet may be formed of a multilayered sheet.

As shown in FIG. 13, the power module 20T according to the embodiment includes: metallic plates $3_1$, $3_2$ divided from each other; a semiconductor device (IGBT $13_1$, $13_2$, and flywheel diodes $14_1$, $14_2$) disposed on the metallic plate $3_1$ via solder 2 under the chip; and a semiconductor device (IGBT $13_3$, $13_4$, and flywheel diodes $14_3$, $14_4$) disposed on the metallic plate $3_2$ via the solder 2 under the chip. The IGBT $13_1$, $13_2$ (two pieces of the chips) are disposed in parallel on the metallic plate $3_1$, and the flywheel diodes $14_1$, $14_2$ (two pieces of the chips) are also disposed in parallel on the metallic plate $3_1$. The respective flywheel diodes $14_1$, $14_2$ are connected in reversely parallel to the respective IGBT $13_1$, $13_2$. Similarly, the IGBT $13_3$, $13_4$ (two pieces of the chips) are disposed in parallel on the metallic plate $3_2$, and the flywheel diodes $14_3$, $14_4$ (two pieces of the chips) are also disposed in parallel on the metallic plate 32. The respective flywheel diodes $14_3$, $14_4$ are connected in reversely parallel to the respective IGBT $13_3$, $13_4$.

More specifically, the semiconductor device (IGBT $13_3$, $13_4$, and flywheel diodes $14_3$, $14_4$) is bonded to the metallic plate $3_2$, to which the leadframe (lower arm) $18_1$ (O) is connected, via the solder 2 under the chip, and the semiconductor device (IGBT $13_1$, $13_2$, and flywheel diodes $14_1$, $14_2$) is similarly bonded to the metallic plate $3_1$, to which the leadframe (upper arm) $18_2$ (P) is connected, via the solder 2 under the chip, and then the wiring is performed using the bonding wires $34_1$, $34_2$, $34_3$, $34_4$.

Next, the power module in the state shown in FIGS. 13 and 14 is set on a metallic mold for transfer molding (not shown), and then is molded using the mold resin 17. More specifically, although illustration is omitted in FIGS. 13 and 14, the metallic plates $3_1$, $3_2$; the first adhesive insulating layer 10 and the second adhesive insulating layer; the metallic land 5 for main electrode wiring and the metallic lands $7_1$, $7_2$ for signal wiring; the metallic land $7_3$ for power wiring; the semiconductor device (IGBT $13_1$, $13_2$, and flywheel diodes $14_1$, $14_2$); the semiconductor device (IGBT $13_3$, $13_4$, and flywheel diodes $14_3$, $14_4$); and the bonding wires 4 (EA), 4 (AN), 4 (AO), the bonding wire 6 and the bonding wires $34_1$, $34_2$, $34_3$, $34_4$, $34_5$ are molded with the mold resin 17 in the same manner as example shown in FIGS. 11 and 12.

Subsequently, the insulating layer 12 is formed on the back side surface of the metallic plates $3_1$, $3_2$.

Alternatively, the power module 20T according to the embodiment may include a cooling plate (heat sink) 100, and the insulating layer 12 may be disposed at the cooling plate side, in the same manner as example shown in FIG. 11.

Alternatively, the insulating layer 12 may include: a relatively-hard insulating layer 12a disposed at the metallic plate $3_1$, $3_2$ side; and a relatively-soft insulating layer 12b disposed at the side opposite to the metallic plates $3_1$, $3_2$, in the same manner as example shown in FIG. 12.

Alternatively, the power module 20 may include a cooling plate (heat sink) 100, and the relatively-soft insulating layer 12b may be disposed at the cooling plate (heat sink) 100 side, in the same manner as example shown in FIG. 12.

In the power module 20T according to the embodiment, the metallic plates $3_1$, $3_2$ may be connected to each other with a resin connecting plate (not shown). Even if a force at the time of molding is applied on the bonding wires which are bonded to the semiconductor device etc., bonding portions are not damaged, thereby improving a reliability of manufacturing. Moreover, the resin connecting plate has a thermal resistance equal to or higher than a molding temperature of the mold resin 17. Moreover, the resin connecting plate may be connected to between the metallic plates $3_1$, $3_2$ via a screw.

Moreover, the resin connecting plate may be formed of one selected from the group consist of polyphenyl sulfide (PPS), polyethyl ethyl ketone (PEEK), and polyimide (PI). When the power module 20T in the state shown in FIG. 13 is set on the metallic mold for transfer molding (not shown) and then is molded using the mold resin 17, the resin connecting plate is also subjected to the resin molding as it is.

Although illustration is omitted, a notch (protruding portion) may be provided on a plane of the resin connecting plate opposite to the metallic plate $3_1$, $3_2$, and a notch hole (concave region) engaged to the notch (protruding portion) 29 may be formed on the opposed metallic plates $3_1$, $3_2$. According to such a configuration, a positional displacement in a direction of rotation due to the screwing by using the screw can be reduced, thereby achieving more precise positioning of the circuit pattern.

In the power modules 20, 20T according to the embodiment, the wiring pattern can be fixed by bonding on the metallic plates, e.g. a copper plate, with the inorganic adhesive agent etc., instead of the ceramics substrate required for the comparative example.

In the power modules 20, 20T according to the embodiment, by using such a circuit substrate, substrates which had to be purchased from board maker, etc. can be made on one's own, thereby reducing a member cost. Moreover, a substrate template required for every circuit pattern becomes unnecessary, thereby reducing the substrate template cost. Moreover, since the area of the insulating layer with a small thermal expansion coefficient relatively decreases, a variation in the thickness of the under chip solder decreases, thereby reducing warpages of the whole substrate, and realizing stabilization of the quality.

Examples of Power Module

Hereinafter, there will now be explained examples of the power modules 20 and 20T according to the embodiment. Also in the power modules 20, 20T explained hereinafter, the wiring pattern can be fixed by bonding on the metallic plates, e.g. a copper plate, with the inorganic adhesive agent etc., instead of the ceramics substrate.

Figure 16A:
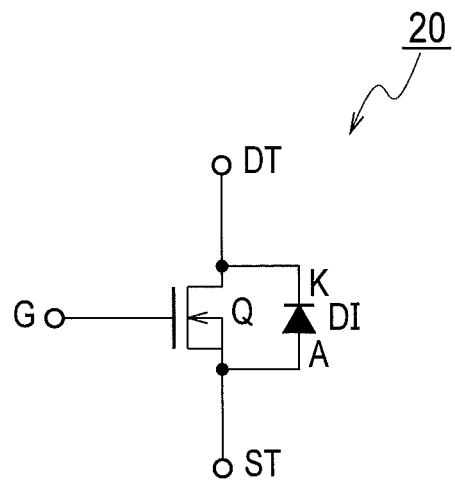
FIG. 16A is a schematic circuit representative diagram showing an SiC metal oxide semiconductor insulated gate field effect transistor (MOSFET), which is the power module according to the embodiment.
Figure 16B:
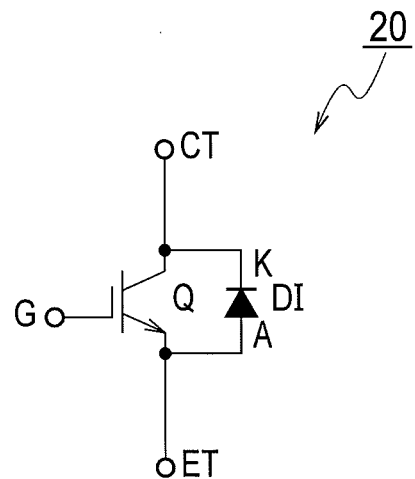
FIG. 16B is a schematic circuit representative diagram of the IGBT of the 1-in-1 module, which is the power module according to the embodiment.

FIG. 16A shows a schematic circuit representative of an SiC MOSFET of the 1-in-1 module, which is the power module 20 according to the embodiment. FIG. 16B shows a schematic circuit representation of the IGBT of the 1-in-1 module.

A diode DI connected in reversely parallel to the MOSFET Q is shown in FIG. 16A. A main electrode of the MOSFET Q is expressed with a drain terminal DT and a source terminal ST. Similarly, a diode DI connected in reversely parallel to the IGBT Q is shown in FIG. 16B. A main electrode of the IGBT Q is expressed with a collector terminal CT and an emitter terminal ET.

Figure 17:
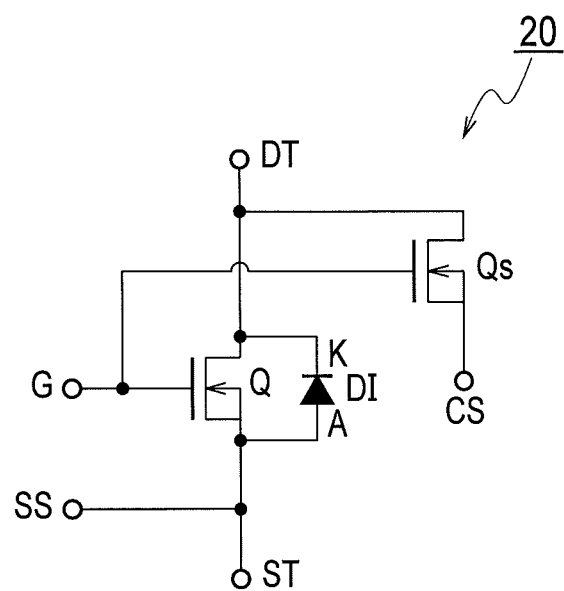
FIG. 17 is a detail circuit representative diagram of the SiC MOSFET of the 1-in-1 module, which is the power module according to the embodiment.

Moreover, FIG. 17 shows a detailed circuit representative of the SiC MOSFET of the 1-in-1 module, which is the power module 20 according to the embodiment.

The power module 20 according to the embodiment includes a configuration of 1-in-1 module, for example. More specifically, one piece of the MOSFET Q is included in one module. As an example, five chips (MOSFET×5) can be mounted thereon, and a maximum of five pieces of the MOSFETs respectively can be connected to one another in parallel. Note that it is also possible to mount a part of five pieces of the chips for the diode DI thereon.

More particularly, as shown in FIG. 17, a sense MOSFET Qs is connected to the MOSFET Q in parallel. The sense MOSFET Qs is formed as a minuteness transistor in the same chip as the MOSFET Q. In FIG. 17, reference numeral SS denotes a source sense terminal, reference numeral CS denotes a current sense terminal, and reference numeral G denotes a gate signal terminal. Note that, also in the semiconductor chip Q according to the embodiment, the sense MOSFET Qs is formed as a minuteness transistor in the same chip.

Figure 18A:
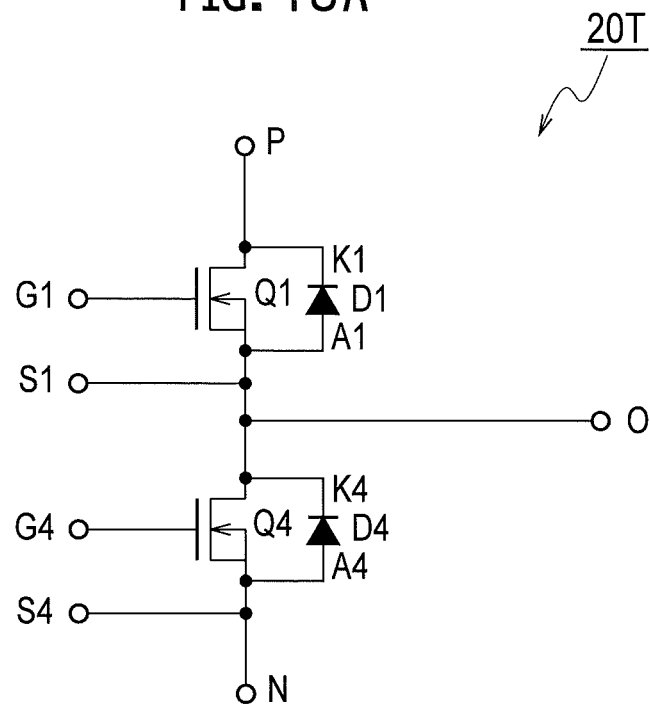
FIG. 18A is a schematic circuit representative diagram of the SiC MOSFET of the 2-in-1 module, which is the power module according to the embodiment.

Moreover, FIG. 18A shows a schematic circuit representative of the SiC MOSFET of the 1-in-1 module, which is the power module 20T according to the embodiment.

As shown in FIG. 18A, two MOSFETs Q1, Q4 are included in one module. Reference numeral G1 denotes a gate signal terminal of the MOSFET Q1, and reference numeral S1 denotes a source terminal of the MOSFET Q1. Reference numeral G4 denotes a gate signal terminal of the MOSFET Q4, and reference numeral S4 denotes a source terminal of the MOSFET Q4. Reference numeral P denotes a positive side power input terminal, reference numeral N denotes a negative side power input terminal, and reference numeral O denotes an output terminal.

Figure 18B:
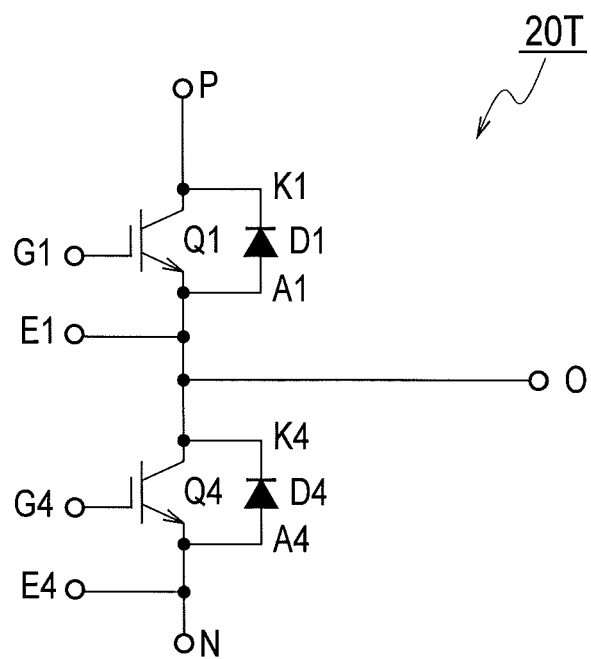
FIG. 18B is a schematic circuit representative diagram of the IGBT of the 2-in-1 module, which is the power module according to the embodiment.

Moreover, FIG. 18B shows a schematic circuit representative of the 2-in-1 module, which is the power module 20 according to the embodiment. As shown in FIG. 18B, two IGBTs Q1, Q4 are built in one module. Reference numeral G1 denotes a gate signal terminal of the IGBT Q1, and reference numeral E1 denotes an emitter terminal of the IGBT Q1. Reference numeral G4 denotes a gate signal terminal of the IGBT Q4, and reference numeral E4 denotes an emitter terminal of the IGBT Q4. Reference numeral P denotes a positive side power input terminal, reference numeral N denotes a negative side power input terminal, and reference numeral O denotes an output terminal.

Configuration Example of Semiconductor Device

Figure 19B:
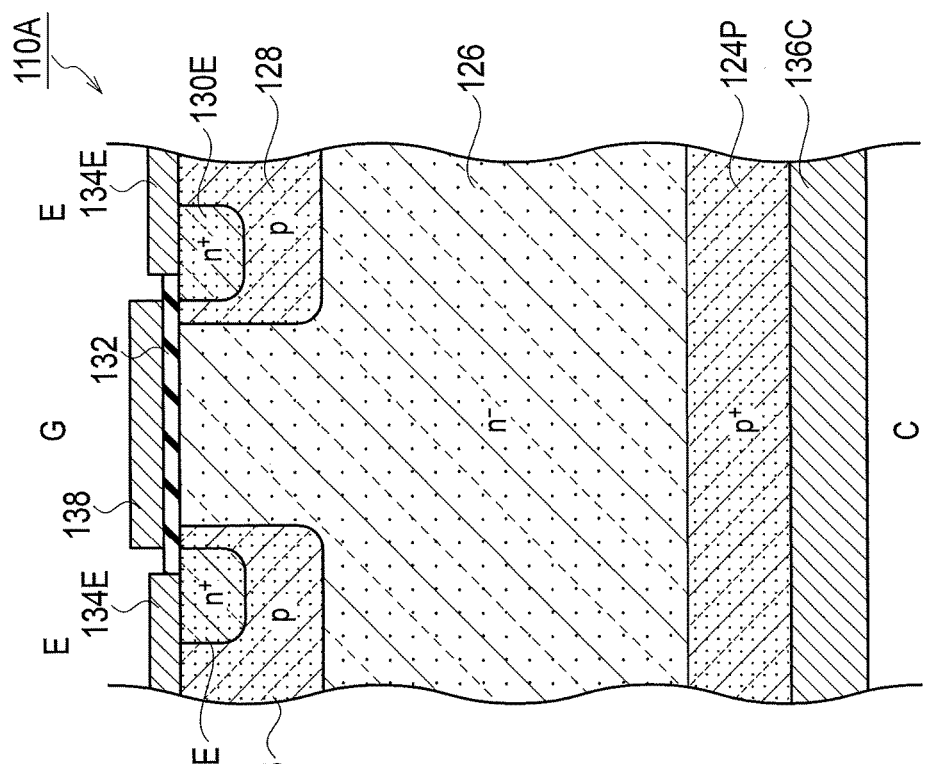
FIG. 19B is a schematic cross-sectional structure diagram of the IGBT, which is an example of the semiconductor device applied to the power module according to the embodiment.
Figure 19A:
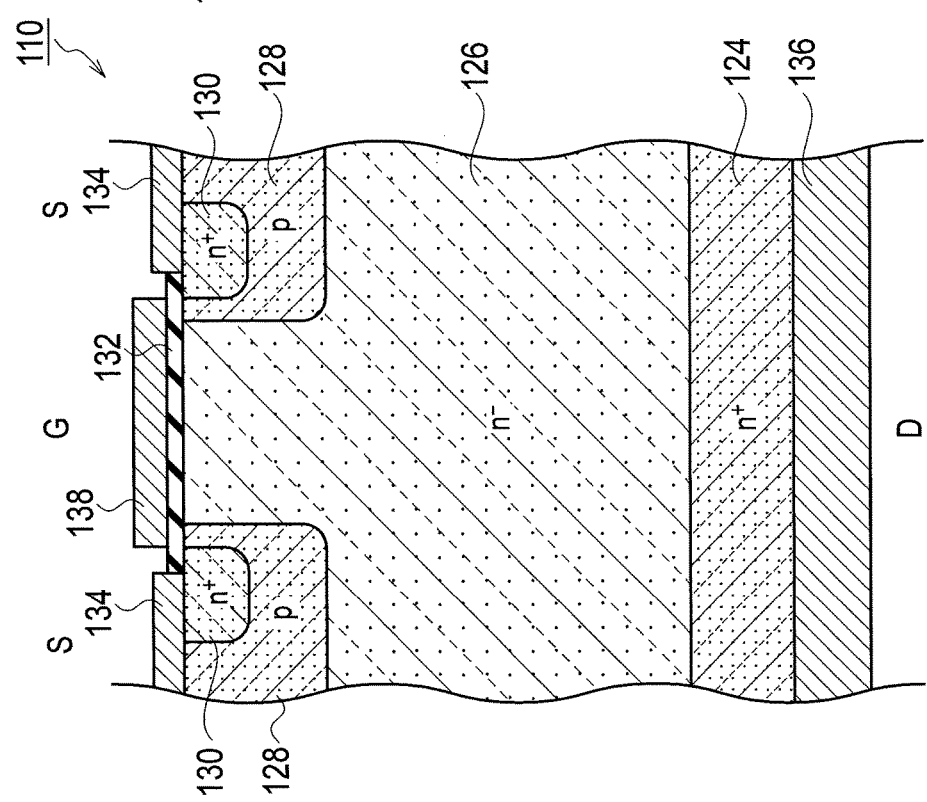
FIG. 19A is a schematic cross-sectional structure diagram of the SiC MOSFET, which is an example of a semiconductor device applied to the power module according to the embodiment.

FIG. 19A shows a schematic cross-sectional structure of an SiC MOSFET, which is an example of a semiconductor device applied to the power module 20T according to the embodiment. FIG. 19B shows a schematic cross-sectional structure of the IGBT.

As shown in FIG. 19A, a schematic cross-sectional structure of the SiC MOSFET as an example of the semiconductor device 110 (Q) applied to the power module 20T according to the embodiment includes: a semiconductor substrate 126 composed of an n⁻ type high resistivity layer; a p type base region 128 formed on the surface side of the semiconductor substrate 126; source regions 130 formed on the surface of the p type base regions 128; a gate insulating film 132 disposed on the surface of the semiconductor substrate 126 between the p type base regions 128; a gate electrode 138 disposed on the gate insulating film 132; a source electrode 134 connected to the source region 130 and the p type base region 128; an n⁺ drain region 124 disposed on a back side surface opposite to the surface of the semiconductor substrate 126; and a drain pad electrode 136 connected to the n⁺ drain region 124.

In FIG. 19A, although the semiconductor device 110 is composed of a planar-gate-type n channel vertical SiC- MOSFET, the semiconductor device 110 may be composed of a trench-gate-type n channel vertical SiC-MOSFET, etc.

Moreover, a GaN based FET etc. instead of SiC MOSFET are also applicable to the semiconductor device 110 (Q) applied to the power module 20T according to the embodiment.

Any one of an SiC based power device, a GaN based power device, and an AlN based power device is applicable to the semiconductor device 110 applied to the power module 20 according to the embodiment.

Furthermore, a semiconductor of which the bandgap energy is from 1.1 eV to 8 eV, for example, can be used for the semiconductor device 110 applied to the power module 20 according to the embodiment.

Similarly, as shown in FIG. 19B, a schematic cross-sectional structure of the IGBT as an example of the semiconductor device 110A (Q) applied to the power module 20T according to the embodiment includes: a semiconductor substrate 126 composed of an n⁻ type high resistivity layer; a p type base region 128 formed on the surface side of the semiconductor substrate 126; an emitter region 130E formed on the surface of the p type base region 128; a gate insulating film 132 disposed on the surface of the semiconductor substrate 126 between the p type base regions 128; a gate electrode 138 disposed on the gate insulating film 132; an emitter electrode 134E connected to the emitter region 130E and the p type base region 128; a p⁺ collector region 124P disposed on a back side surface opposite to the surface of the semiconductor substrate 126; and a collector pad electrode 136C connected to the p⁺ collector region 124P.

In FIG. 19B, although the semiconductor device 110 is composed of a planar-gate-type n channel vertical IGBT, the semiconductor device 110 may be composed of a trench-gate-type n channel vertical IGBT, etc.

FIG. 20 shows a schematic cross-sectional structure of an SiC MOSFET including a source pad electrode SP and a gate pad electrode GP, which is an example of the semiconductor device 110 applied to the power module 20T according to the embodiment. The gate pad electrode GP is connected to the gate electrode 138 disposed on the gate insulating film 132, and the source pad electrode SP is connected to the source electrode 134 connected to the source region 130 and the p type base region 128.

Moreover, as shown in FIG. 20, the gate pad electrode GP and the source pad electrode SP are disposed on an interlayer insulating film 144 for passivation which covers the surface of the semiconductor device 110. Microstructural transistor structure may be formed in the semiconductor substrate 126 below the gate pad electrode GP and the source pad electrode SP in the same manner as the center portion shown in FIG. 19A or 20.

Furthermore, as shown in FIG. 20, the source pad electrode SP may be disposed to be extended onto the interlayer insulating film 144 for passivation, also in the transistor structure of the center portion.

FIG. 21 shows a schematic cross-sectional structure of an IGBT including a source pad electrode SP and a gate pad electrode GP, which is an example of the semiconductor device 110A applied to the power modules 20, 20T according to the embodiment. The gate pad electrode GP is connected to the gate electrode 138 disposed on the gate insulating film 132, and the emitter pad electrode EP is connected to the emitter electrode 134E connected to the emitter region 130E and the p type base region 128.

Moreover, as shown in FIG. 21, the gate pad electrode GP and the emitter pad electrode EP are disposed on an interlayer insulating film 144 for passivation which covers the surface of the semiconductor device 110A. Microstructural IGBT structure may be formed in the semiconductor substrate 126 below the gate pad electrode GP and the emitter pad electrode EP in the same manner as the center portion shown in FIG. 19B or 21.

Furthermore, as shown in FIG. 21, the emitter pad electrode EP may be disposed to be extended onto the interlayer insulating film 144 for passivation, also in the IGBT structure of the center portion.

Figure 22A:
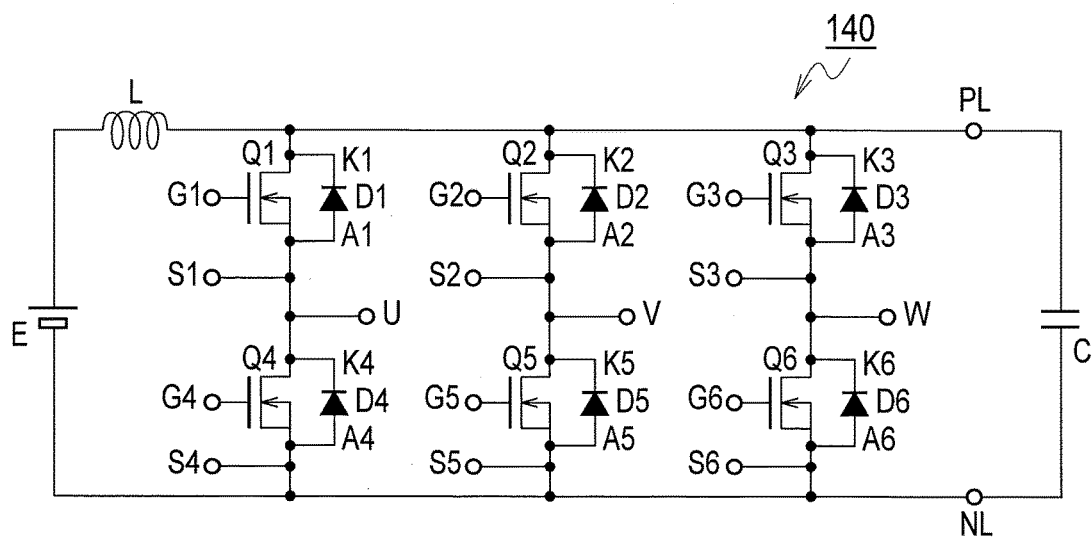
FIG. 22A shows an example of a circuit configuration in which the SiC MOSFET is applied as a semiconductor device, and a snubber capacitor is connected between a power terminal PL and an earth terminal (ground terminal) NL, in a schematic circuit configuration of a three-phase alternating current (AC) inverter composed using the power module according to the embodiment.
Figure 22B:
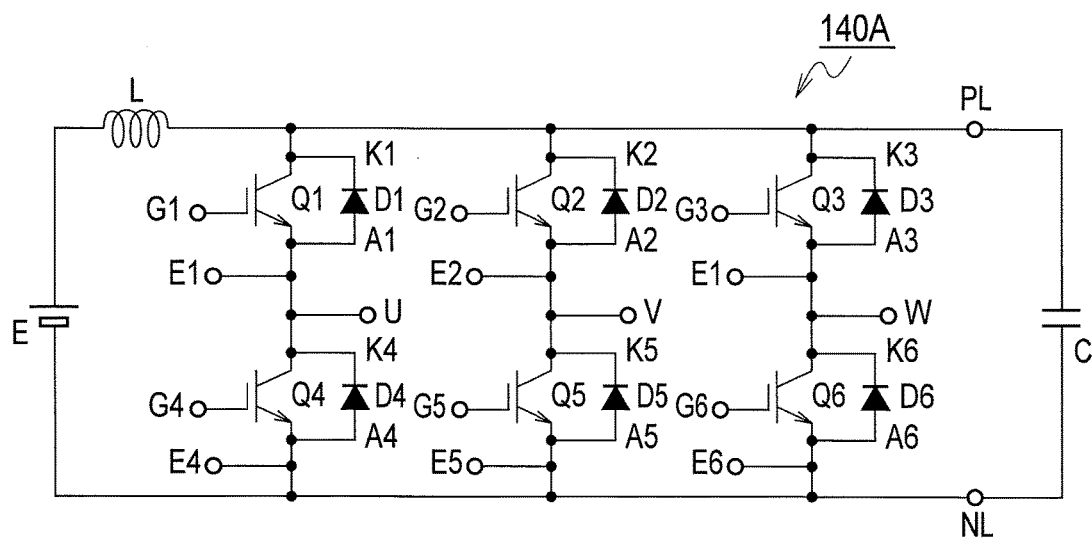
FIG. 22B shows an example of a circuit configuration in which the IGBT is applied as a semiconductor device, and the snubber capacitor is connected between the power terminal PL and the earth terminal (ground terminal) NL, in the schematic circuit configuration of a three-phase AC inverter composed using the power module according to the embodiment.

FIG. 22A shows an example of a circuit configuration in which the SiC MOSFET is applied as a semiconductor device, and a snubber capacitor C is connected between the power terminal PL and the earth terminal (ground terminal) NL, in a schematic circuit configuration of a three-phase AC inverter 140 composed using the power module 20T according to the embodiment. Similarly, FIG. 22B shows an example of a circuit configuration in which the IGBT is applied as a semiconductor device, and a snubber capacitor C is connected between the power terminal PL and the earth terminal (ground terminal) NL, in a schematic circuit configuration of a three-phase AC inverter 140A composed using the power module 20T according to the embodiment.

When connecting the power module 20T according to the embodiment to the power source E, large surge voltage Ldi/dt is produced by an inductance L included in a connection line due to a high switching speed of the SiC MOSFET and IGBT. For example, the surge voltage Ldi/dt is expressed as follows: $Ldi/dt=3\times10^9$ (A/s), where a current change di=300 A, and a time variation accompanying switching dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

Application Examples for Applying Power Module

Next, there will now be explained the three-phase AC inverter 140 composed using the power module 20T according to the embodiment to which the SiC MOSFET is applied as the semiconductor device, with reference to FIG. 23.

Figure 23:
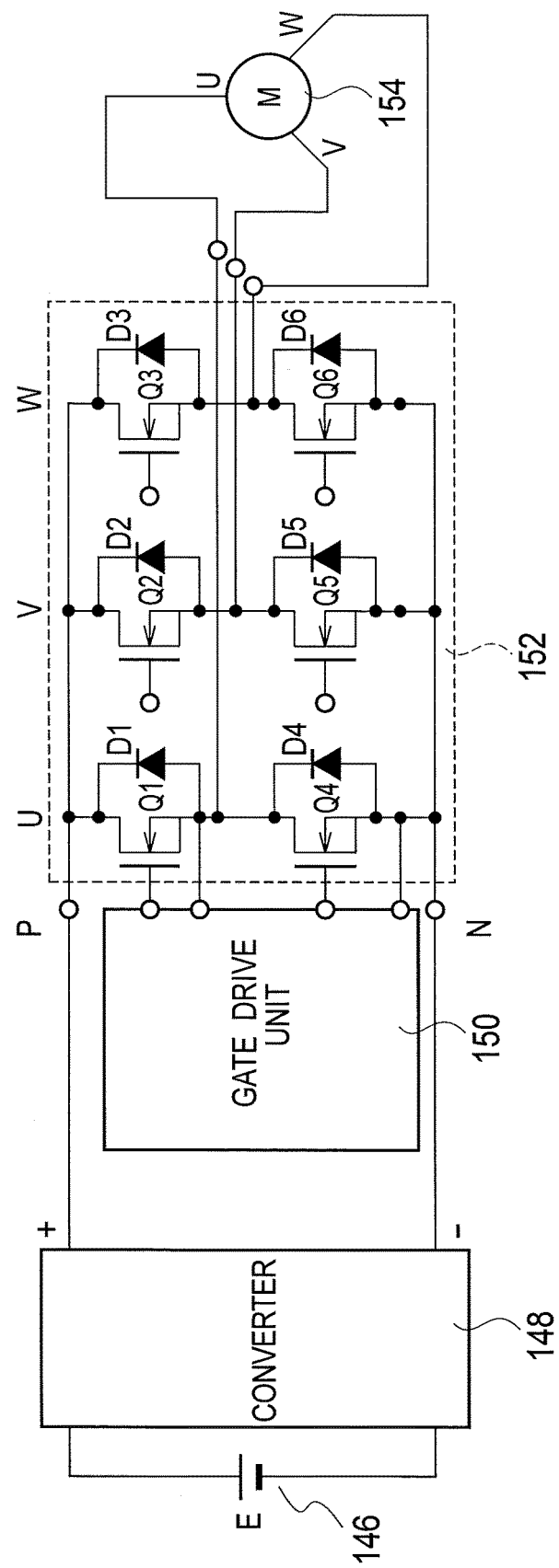
FIG. 23 is a schematic circuit configuration diagram of a three-phase AC inverter composed using the power module according to the embodiment to which the SiC MOSFET is applied as the semiconductor device.

As shown in FIG. 23, the three-phase AC inverter 140 includes: a gate drive unit 150; a power module unit 152 connected to the gate drive unit 150; and a three-phase AC motor unit 154. U-phase, V-phase, and W-phase inverters are respectively connected to the three-phase AC motor unit 54 so as to correspond to U phase, V phase, and W phase of the three-phase AC motor unit 154, in the power module unit 152. In this case, although the gate drive unit 150 is connected to the SiC MOSFETs Q1, Q4 as shown in FIG. 23, the gate drive unit 150 is similarly connected also to the SiC MOSFETs Q2, Q5 and the SiC MOSFETs Q3, Q6 (not shown in FIG. 23).

In the power module unit 152, the SiC MOSFETs Q1, Q4, and Q2, Q5, and Q3, Q6 having inverter configurations are connected between a positive terminal (+) and a negative terminal (−) to which the converter 148 in a storage battery (E) 146 is connected. Furthermore, flywheel diodes D1-D6 are respectively connected reversely in parallel between the source and the drain of the SiC MOSFETs Q1-Q6.

Although the structure of the single phase inverter corresponding to U phase portion of FIG. 23 has been explained in the power module 20T according to the embodiment, the three-phase power module unit 152 can also be formed also by similarly forming V phase and W phase inverters.

Next, there will now be explained the three-phase AC inverter 140A composed using the power module 20T according to the embodiment to which the IGBT is applied as the semiconductor device, with reference to FIG. 24.

Figure 24:
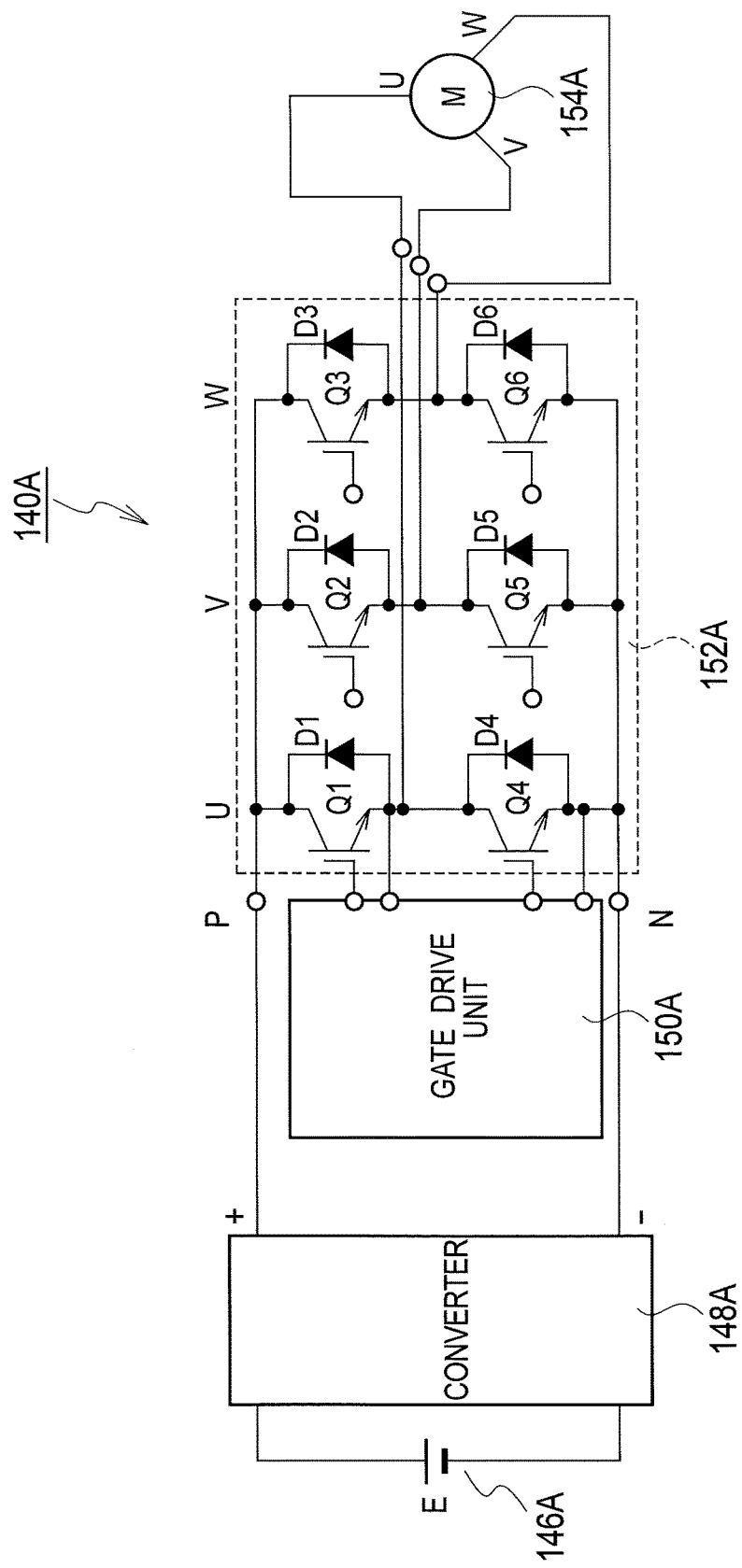
FIG. 24 is a schematic circuit configuration diagram of a three-phase AC inverter composed using the power module according to the embodiment to which the IGBT is applied as the semiconductor device.

As shown in FIG. 24, the three-phase AC inverter 140A includes: a gate drive unit 150A; a power module unit 152A connected to the gate drive unit 150A; and a three-phase AC motor unit 154A. U-phase, V-phase, and W-phase inverters are respectively connected to the three-phase AC motor unit 54 so as to correspond to U phase, V phase, and W phase of the three-phase AC motor unit 154A, in the power module unit 152A. In this case, although the gate drive unit 150A is connected to the IGBTs Q1, Q4 as shown in FIG. 24, the gate drive unit 150A is similarly connected also to the IGBTs Q2, Q5 and the IGBTs Q3, Q6 (not shown in FIG. 24).

In the power module unit 152A, the IGBTs Q1, Q4, and Q2, Q5, and Q3, Q6 having inverter configurations are connected between a positive terminal (+) and a negative terminal (−) to which the converter 148A in a storage battery (E) 146A is connected. Furthermore, flywheel diodes D1-D6 are respectively connected reversely in parallel between the emitter and the collector of the IGBTs Q1-Q6.

Although the structure of the single phase inverter corresponding to U phase portion of FIG. 24 has been explained in the power module 20T according to the embodiment, the three-phase power module unit 152A can also be formed also by similarly forming V phase and W phase inverters.

The power module according to the embodiment can be formed as any one selected from the group consist of 1-in-1 module, 2-in-1 module, 4-in-1 module, 6-in-1 module, and 7-in-1 module.

Moreover, one semiconductor device selected from the group consist of an IGBT, a diode, ab Si based MOSFET, and an SiC based MOSFET and a GaNFET is applicable to the power module according to the embodiment.

As explained above, according to the embodiment, there can be provided a power module having reduced cost, reduced warpage of the whole of a substrate, stabilized quality, and improved reliability; and a fabrication method for such a power module.

Other Embodiments

As explained above, the embodiment has been described, as a disclosure including associated description and drawings to be construed as illustrative, not restrictive. This disclosure makes clear a variety of alternative embodiment, working examples, and operational techniques for those skilled in the art.

Such being the case, the present embodiment covers a variety of embodiments, whether described or not.

INDUSTRIAL APPLICABILITY

The power module according to the embodiment can be used for semiconductor modules, e.g. IGBT modules, diode modules, MOS modules (Si, SiC, GaN), etc. The power module according to the embodiment can also be used for structures which do not use insulating substrates, e.g. Direct Copper Bond (DBC) incase type modules.

What is claimed is:

1. A power module comprising:
   an insulating layer;
   a metallic plate disposed on the insulating layer;
   a semiconductor device disposed on the metallic plate;
   a first adhesive insulating layer and a second adhesive insulating layer respectively disposed on the metallic plate;
   a first metallic land for main electrode wiring disposed only on the first adhesive insulating layer; and
   a second metallic land for signal wiring disposed only on the second adhesive insulating layer.

2. The power module according to claim 1, wherein the first adhesive insulating layer and the second adhesive insulating layer comprise an inorganic adhesive agent.

3. The power module according to claim 2, wherein the inorganic adhesive agent contains a filler, and the filler is one selected from a group consisting of silica, alumina, zirconia, and a complex thereof.

4. The power module according to claim 1, wherein the first adhesive insulating layer and the second adhesive insulating layer comprise an insulating sheet.

5. The power module according to claim 4, wherein the insulating sheet is formed of one selected from a group consisting of an epoxy based resin and a polyimide based resin.

6. The power module according to claim 5, wherein the insulating sheet is a multilayered sheet.

7. The power module according to claim 1, wherein the metallic plate is formed of one selected from a group consisting of copper, aluminum, copper alloy and an aluminum alloy.

8. The power module according to claim 1, further comprising:
   a first bonding wire configured to electrically connect between the semiconductor device and the first metallic land for main electrode wiring; and
   a second bonding wire configured to electrically connect between the semiconductor device and the second metallic land for signal wiring; and
   a mold resin for molding the metallic plate, the first adhesive insulating layer and the second adhesive insulating layer, the first metallic land for main electrode wiring and the second metallic land for signal wiring, the semiconductor device, and the first bonding wire and the second bonding wire.

9. The power module according to claim 1, wherein the insulating layer comprises a first insulating layer disposed at a metallic plate side, and a second insulating layer disposed at a side opposite to the metallic plate side, and wherein the second insulating layer is softer than the first insulating layer.

10. The power module according to claim 9, further comprising:
    a cooling plate, wherein
    the second insulating layer is disposed at a side of the cooling plate.

11. The power module according to claim 9, wherein the second insulating layer is formed of an organic material.

12. The power module according to claim 9, wherein the second insulating layer is formed of a silicone based resin.

13. The power module according to claim 9, wherein the second insulating layer is filled up with a high thermally-conductive filler.

14. The power module according to claim 13, wherein the filler comprises at least one selected from a group consisting of aluminium oxide, silicon oxide, aluminum nitride, silicon nitride, boron nitride, beryllia, and magnesia.

15. The power module according to claim 9, wherein the first insulating layer is formed of an organic material.

16. The power module according to claim 9, wherein the first insulating layer is formed of at least one selected from a group consisting of an epoxy based resin, an urethane system resin, an acrylic resin, and a silicone based resin.

17. The power module according to claim 9, wherein the first insulating layer is filled up with a high thermally-conductive filler.

18. The power module according to claim 17, wherein the filler comprises at least one selected from a group consisting of aluminium oxide, silicon oxide, aluminum nitride, silicon nitride, boron nitride, beryllia, and magnesia.

19. The power module according to claim 1, wherein the power module is formed as any one selected from a group consisting of 1-in-1 module, 2-in-1 module, 4-in-1 module, 6-in-1 module, and 7-in-1 module.

20. The power module according to claim 1, wherein the semiconductor device comprises one selected from a group consisting of an IGBT, a diode, an Si based MOSFET, an SiC based MOSFET and a GaNFET.

21. The power module according to claim 1, wherein a plurality of the semiconductor devices are disposed on the metallic plate, wherein each of the first metallic land and the second metallic land are common to each semiconductor device.

* * * * *